(12) United States Patent
Sakanashi et al.

(10) Patent No.: US 7,254,273 B2
(45) Date of Patent: Aug. 7, 2007

(54) DATA CODING METHOD AND DEVICE, AND DATA CODING PROGRAM

(75) Inventors: Hidenori Sakanashi, Ibaraki (JP); Tetsuya Higuchi, Ibaraki (JP)

(73) Assignees: Evolvable Systems Research Institute, Inc., Tokyo (JP); National Institute of Advanced Indusrial Science and Technology, Tokyo (JP)

( * ) Notice: Subject to any disclaimer, the term of this patent is extended or adjusted under 35 U.S.C. 154(b) by 770 days.

(21) Appl. No.: 10/450,835

(22) PCT Filed: Dec. 26, 2001

(86) PCT No.: PCT/JP01/11460

§ 371 (c)(1), (2), (4) Date: Jun. 25, 2003

(87) PCT Pub. No.: WO02/054757

PCT Pub. Date: Jul. 11, 2002

(65) Prior Publication Data

US 2005/0100232 A1    May 12, 2005

(30) Foreign Application Priority Data

Dec. 28, 2000    (JP) .......................... 2000-402164

(51) Int. Cl.
*G06K 9/46* (2006.01)
*G06K 9/62* (2006.01)
*G06K 9/00* (2006.01)

(52) U.S. Cl. .................... 382/238; 382/209
(58) Field of Classification Search ............ 382/156, 382/159, 160, 165, 173, 190, 209, 218, 232, 382/233, 244, 246, 253, 238; 375/240.01, 375/240.16, 240.22, 240.23; 341/50–52, 341/55, 87, 95
See application file for complete search history.

(56) References Cited

U.S. PATENT DOCUMENTS 5,861,824 A    1/1999    Ryu et al. .................... 341/50

(Continued)

FOREIGN PATENT DOCUMENTS

JP    4-250772    9/1992

(Continued)

OTHER PUBLICATIONS

Masaharu Tanaka, et al.; *Bi-level Image Coding for Digital Printing Using Genetic Algorithm* (w/English translation); Denshi Joho Tsushin Gakkai Ronbunshi, vol. J83-D-II, No. 5, pp. 1274-1283, May 2000.

Masaharu Tanaka; Denshi Joho Tsushin Gakkai ronbunshi, vol. J83-D-2, No. 5, pp. 1274-1283, May 20, 2000.

*Primary Examiner*—Amir Alavi
(74) *Attorney, Agent, or Firm*—Westerman, Hattori, Daniels & Adrian, LLP.

(57) ABSTRACT

A data compression method uses a template. In the template, the template optimizing is performed by an artificial intelligent technique (such as a genetic algorithm). The artificial intelligent techniqiue is applied to segments defined by diving input data into uniform segment units. The compression method contributes to enhancing the prediction accuracy. The data is compressed using the results of optimization, and a database is updated to improve the compression efficiency and speed of the subsequent processings. By updating a database by using an optimized template, a template for improving the prediction accuracy is obtained quickly without applying any artificial intelligent technique.

6 Claims, 36 Drawing Sheets

U.S. PATENT DOCUMENTS

| | | | |
|---|---|---|---|
| 5,867,600 A | 2/1999 | Hongu | 382/247 |
| 6,229,921 B1 * | 5/2001 | Wenzel et al. | 382/209 |
| 6,301,387 B1 * | 10/2001 | Sun et al. | 382/217 |
| 6,389,163 B1 * | 5/2002 | Jodoin et al. | 382/173 |
| 6,470,092 B1 * | 10/2002 | Li et al. | 382/132 |
| 6,738,517 B2 * | 5/2004 | Loce et al. | 382/209 |
| 6,741,725 B2 * | 5/2004 | Astle | 382/103 |
| 6,944,331 B2 * | 9/2005 | Schmidt et al. | 382/165 |
| 7,039,229 B2 * | 5/2006 | Lin et al. | 382/165 |
| 2003/0086616 A1 * | 5/2003 | Oh et al. | 382/209 |

FOREIGN PATENT DOCUMENTS

| | | |
|---|---|---|
| JP | 4-250772 A | 9/1992 |
| JP | 6-90363 | 3/1994 |
| JP | 6-90363 A | 3/1994 |
| JP | 6-326876 | 11/1994 |
| JP | 6-326876 A | 11/1994 |
| JP | 8-191396 | 7/1996 |
| JP | 8-191396 A | 7/1996 |
| JP | 9-69951 | 3/1997 |
| JP | 9-69951 A | 3/1997 |
| JP | 9-135358 | 5/1997 |
| JP | 9-135358 A | 5/1997 |
| JP | 11-243491 | 9/1999 |
| JP | 11-243491 A | 9/1999 |

\* cited by examiner

Fig. 16

| System that generated Image | System Version | Resolution | Line Number | Screen Angle | Image Analysis Result (Input Template) | Output Template |
|---|---|---|---|---|---|---|
| | | | | | | |

| | | |
|---|---|---|
| | | |
| | | |
| | | |
| | 90 | x |
| | 80 | 100 |
| | | |
| | 70 | |
| | | | x : Noticed Pixel (b)

| | | |
|---|---|---|
| | | |
| | | |
| | | |
| | 90 | x |
| | 64.8 | 100 |
| | | |
| | 70 | |
| | | | x : Noticed Pixel

Fig. 20
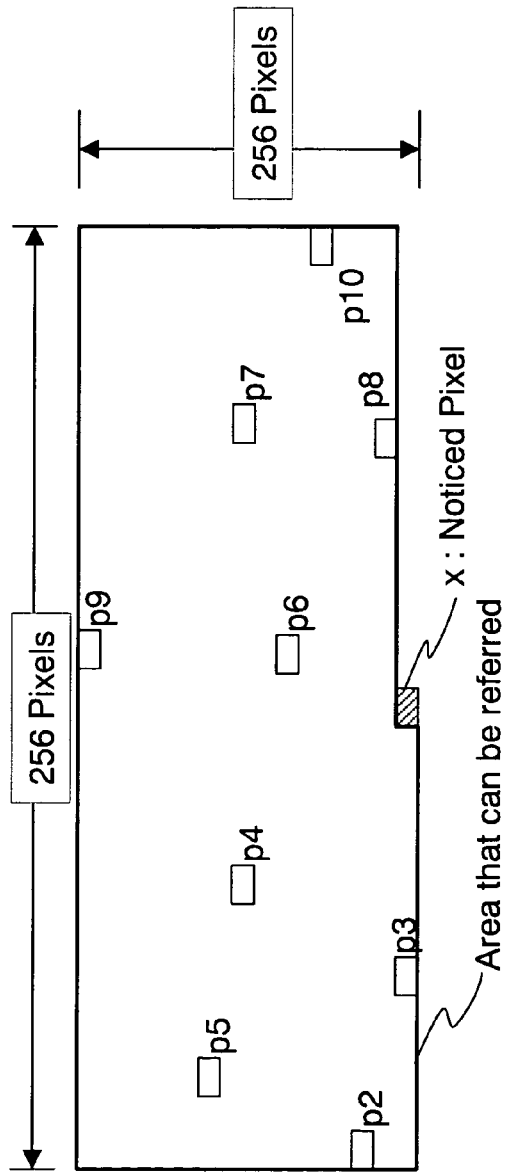
(a) Template
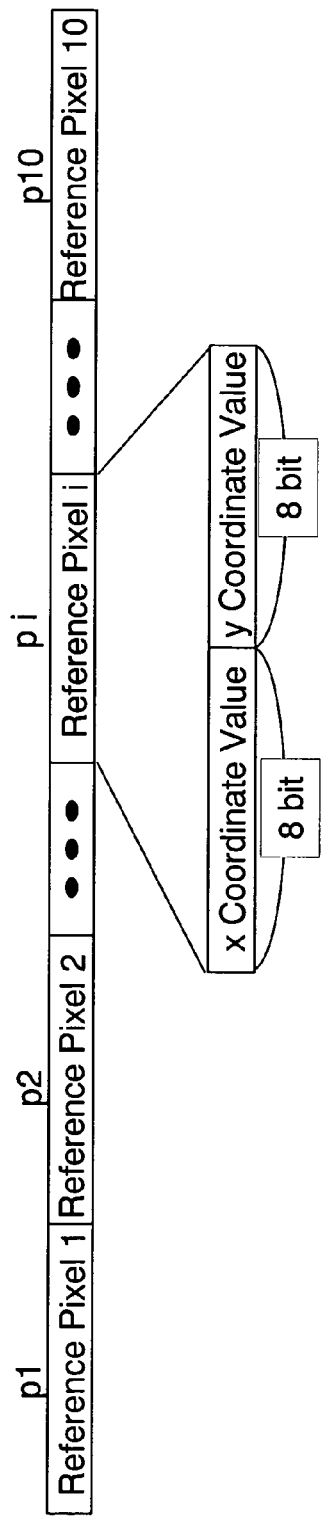
(b) Chromosome Expression

Fig. 21
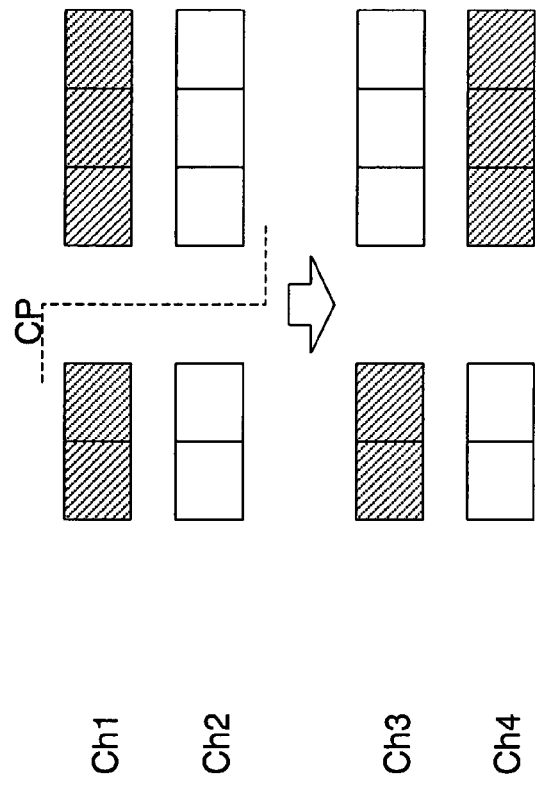
(a) Chromosome Crossover in Genetic Algorithm
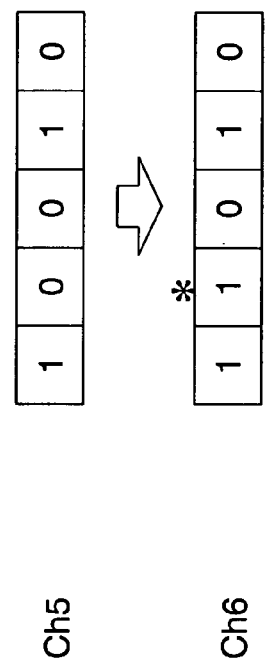
(b) Chromosome Mutation in Genetic Algorithm

DATA CODING METHOD AND DEVICE, AND DATA CODING PROGRAM

TECHNOLOGY AREA OF THE INVENTION

In relation to a predictive data coding method typically for coding of image information wherein prediction of the value of a pixel in said image information is carried out by using the status of pixels that surround said pixel and wherein said image information is coded by using the result of said prediction, the invention provides a method to optimize the position pattern of pixels surrounding said pixel fast and accurately when it is referred, in order to improve efficiency of data compression.

BACKGROUND OF THE INVENTION

In a predictive data coding method, data compression efficiency increases as the accuracy in prediction of each pixel value becomes higher. The prediction accuracy can be raised by increasing the number of pixels that are referred in the prediction process. A pixel that is referred in the prediction process will be notified as "a reference pixel" hereafter. The prediction accuracy can be raised also by optimizing the position pattern of reference pixels.

FIG. 2 shows a position pattern of reference pixels in the JBIG (Joint Bi-level Image Experts Group) coding architecture. Here, JBIG is the international standardization body for bi-level image coding where each pixel of an image takes only a binary value of either "one" or "zero". The position pattern of reference pixels mentioned above will be referred as a "template" hereafter.

In FIG. 2, the square with hatches shows the noticed pixel, and squares p1 to p9 and the square "A" show reference pixels. Among these 10 reference pixels, the pixel denoted by A is called an AT (adaptive template) pixel, and this pixel is allowed to move to any arbitrary position among nearly 256×256 pixel positions depicted in the figure. In most image coding systems using JBIG coding architecture, however, the AT pixel position is restricted to move to one of the eight squares with a cross as shown in the figure, since it is very difficult and it requires much calculation cost to find the most appropriate position for the AT pixel among vast number of possible positions. In the JBIG recommendation document, a method that uses surrounding pixels having the strongest correlation with the noticed pixel is recommended as the AT pixel position determination method.

In compression coding of images such as characters or figures, using a template wherein all reference pixels are placed close to the noticed pixel is generally effective for improving accuracy of prediction (see Kato, et al: An Adaptive Markov Model Coding Method for Two-level Images using Dynamic Selection of Reference Pixels, IEICE Transactions, volume J70-B, number 7). For this reason, the above-mentioned JBIG recommended template works effectively in predicting the value of the noticed pixel with high accuracy, resulting in a high data compression rate.

In compression coding of natural images, however, higher prediction accuracy can be obtained in many cases by placing reference pixels at scattered positions in a wider area of the image. In this case, how to place reference pixels in scattered positions depends largely on the nature of the image. In a two-level image that is coded by using the cluster type dithering, for example, a higher compression rate cannot be obtained unless the reference pixel position distribution reflects not only features resulting from the image nature but also the periodical features resulting from dithering, since pixels with strong correlation periodically appear in the image when dithering is applied. Since an image generated by one of other dithering types, such as the vortex type, the Bayer type or the error scattering type, has also features peculiar to each coding method used, it is necessary to use a specific template corresponding to the coding method used, in order to attain higher data compression efficiency.

Unfortunately, however, when a bi-level coded natural image is given, it is very difficult to know which type of dithering has been used for coding that image. Furthermore, it is almost impossible to generate an optimum template through simple calculation, considering features arising from the pattern of the image. This is the reason why so many architectures to realize high data compression rate in image coding have been proposed.

For example, in the method proposed by Kato et al. of Utsunomiya University or in the method proposed in U.S. Pat. No. 5,023,611 by Lucent Technologies Inc., the number of coincidence between the value of the noticed pixel and the value of a pixel at one of the positions surrounding the noticed pixel is counted for each pixel in the two-level image, and when the counting results satisfy a specified condition during the compression procedure, pixels at the surrounding position having larger coincidence numbers are included in the new template as reference pixels, in order of coincidence number value.

Besides the method of changing templates successively as mentioned above, a method to determine a template based on the correlation amplitudes of surrounding pixels that are obtained before compression for the whole image, and the method to select a template that is matched to the image information among previously prepared templates are cited in Kokai No. 6-90363 by Ricoh Company, Limited.

However, methods to determine a template simply based on the amplitude of the correlation between surrounding pixels and the noticed pixel cannot determine the optimum template for a two-level image that is coded by the cluster type dithering method. This is because a template determined simply by correlation amplitude usually becomes the one around which reference pixels are densely crowded as shown in FIG. 1(a) since correlation between pixels within the same cluster is stronger, despite correlation between plural clusters should be considered.

On the contrary, in the method proposed in Kokai No. 5-30362 by Fujitsu Ltd., distance between the run up to the noticed pixel and the preceding run with the same color is used as the measure of periodicity. Here, a "run" means a string of pixels where the same pixel value continues on the same scanning line. This method, however, cannot work effectively when the image has no periodicity.

In the method proposed in Kokai No. 11-243491 by Mitsubishi Heavy Industries Ltd., the multiple regression analysis and a genetic algorithm using the compression rate as the evaluation function are used for the optimization of the template, considering both the mesh point structure and the features arising from the image pattern. Genetic algorithms are calculation methods in modeling biological evolution or adaptation in the nature, and also applied to artificial intelligence as powerful means of seeking. By using a genetic algorithm, it becomes possible to find an optimum template among a vast number of possible candidates.

The proposed method, however, has a problem that the processing speed is extremely slow. This problem arises from the implementation of a genetic algorithm. In the calculation process of a genetic algorithm, a population consisting of a plural number of solution candidates is first prepared, each candidate is evaluated and then a new population is generated based of the evaluation results. This first calculation cycle is carried out to obtain the first generation of the solution, then, recurrent similar calculation cycles are carried out to obtain each new generation until a specified finishing condition is satisfied. Consequently, this method requires evaluation time expressed by (the size of the population)×(the number of the generations).

Meanwhile, in the method proposed in Kokai No. 11-243491, it is necessary to compress once the whole noticed image and to calculate the resultant compression rate before finishing one stage of evaluation, since the method uses the compression rate as the evaluation measure. For this reason, the calculation time required for optimizing the template in this method becomes (the size of the population)×(the number of the generations) times larger than the calculation time without optimizing. For example, if the size of the population is 30 and the generation number is 100, then, the calculation time required for optimizing the template in this method becomes 3,000 times larger than the calculation time without optimizing.

If one of above-mentioned genetic algorithms is applied to an image transmission system such as the facsimile, optimizing the template for compression by using the genetic algorithm takes even much more time than required for the transmission of the whole image data without compression. Likewise, it is by no means practical to use those methods as explained for compressing an image with a size of several hundred Giga-bytes, an image for printing, for example, since those methods require a vast amount of time for calculation.

The purpose of this invention is to solve such problems in predictive coding as mentioned above, or to provide a method of adaptively adjusting a template (a position pattern of reference pixels) in order to obtain always high data compression rate for various kinds of image information.

SUMMARY OF THE INVENTION

In order to attain the object of this invention, the process of this invention, includes the following three factors: (a) the inputted image is divided into several areas based on the local feature resemblance, (b) the prediction accuracy is increased through optimization of the template for each divided area by using a database, by analyzing data and by using an artificial intelligence engine with an accelerator and (c) the database is renewed by using the result of the optimization in order that the compression efficiency and the calculation speed can be further increased in the next recursive process of optimization.

Regarding above factor (a) in order to divide the inputted image information appropriately into several areas, it is necessary to divide the image into several areas each of which is homogeneous within the same area and heterogeneous to areas outside of the area. By dividing the image in this way, it becomes possible to use the same template within one area unconditionally. It also becomes possible to optimize the template flexibly by dividing the image appropriately, and this results in higher accuracy of predicting pixel values in the divided image block, and consequently in a higher compression rate for the whole image.

There are two different ways of determining how to divide the image, the one-path method and the two-path method. In the two-path method, the whole image is inputted first in order to be analyzed for determining how to divide it, and then each area is inputted according to the division. This method provides a precise division way since information for the whole image is utilized, but on the other hand the processing speed becomes lower, since the method requires data input twice. In the one-path method, on the contrary, the division way is determined successively during the image data input. The method cannot always provide the optimum division since it cannot reflect the features of the whole image, but it can provide a faster processing speed. This invention is based on the one-path method, and the image data is inputted along the luster direction. The inputted data is analyzed line by line in order to appropriately divide the image into areas. Details of dividing method and actual procedures will be shown later in the embodiment explanation.

Regarding above factor (b), the present invention differs from conventional methods in that a template with higher accuracy is generated in the present invention through statistical processing and through analysis, by assuming the dithering type used for generating the image to be compressed. Additionally, it is possible not only to increase the efficiency of the compression in coding, but also to reduce drastically the time required for determining the template, by using a database in which relationship between the assumed dithering type and the template is stored. Furthermore, by adaptively matching the template obtained through the above-mentioned process to the image pattern utilizing an artificial intelligence engine such as a genetic algorithm, a renewed template that can be used for further increasing the accuracy of prediction can be obtained. Also, speed up in template generation is realized at the same time, by extracting a portion of the image without damaging image features in the large view. Finally, regarding above factor (c), by feeding back the new template obtained in the process that is explained above for characteristic (b) to renew the database, an image data compression system that become wiser as it is used more can be established. In other words, by recurrently processing image data blocks with the same or similar features, it becomes possible to obtain rapidly a template that can contribute to increasing prediction accuracy, even without using a sophisticated artificial intelligence technology. This scheme may be considered as one of autonomous self-learning expert systems.

DESCRIPTION OF DRAWING

FIG. 16 is a figure to explain an example of the template database structure that is used in image analysis.

FIG. 17 is a figure to explain the operation principle of correlation analysis that is carried out during the image analysis.

FIG. 20 is a figure to explain chromosome expression in a genetic algorithm.

FIG. 21 is a figure to explain the operation principles of crossover and mutation.

DESCRIPTION OF PREFERRED EMBODIMENT

The preferred embodiment of the invention is explained in detail in the following, referring to figures.

The First Preferred Embodiment Example

Figure 6:
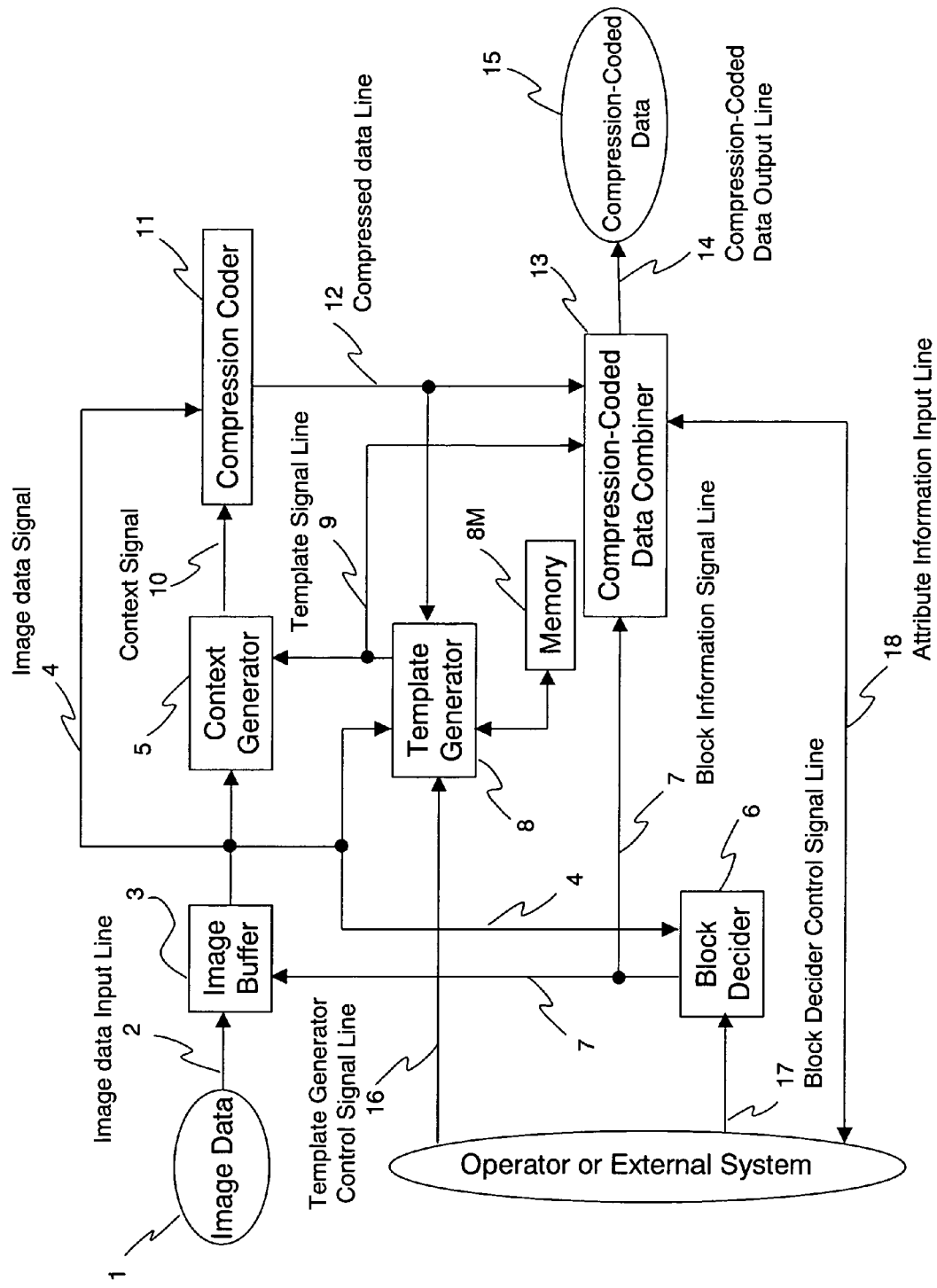
FIG. 6 is a block diagram of the transmitting side of the image transmission system in the embodiment example of this invention.

FIG. 6 is a block diagram of the transmitting side of the image transmission system in the first embodiment example of this invention. Image data 1 that is inputted through the image input line 2 is stored temporally in the image buffer 3 in FIG. 6. The stored image data is sent to the block decider 6, the context generator 5, the template generator 8 and the compression coder 11 through the image data signal line 4, based on the block information provided by the block decider 6.

The block decider 6 divides inputted image data into blocks by features, so that the following processes can be carried out by each block in order to raise the efficiency in compression coding. Image data is inputted into the block decider 6 through the image data signal line 4, the way of image division (the size and the position of each block) is decided by the decider 6 and outputted through the block information signal line 7. The way of image division can be otherwise decided or controlled by an external means instead of the block decider 6, by using the block decider control signal that is provided through the block decider control signal line 17.

The template generator 8 determines the optimum template that can contribute to the maximum compression rate for the inputted image data. The image data through the image data signal line 4 and the compressed data through the compressed data signal line 12 are inputted to the template generator 8. The compressed data is used as a measure for fitness of the generated template. Compression coding by using an externally determined template is also possible, by forcefully designate the template from an external means through the template generator control signal line 16.

The context generator 5 generates a pattern of values of reference pixels, or a context, in the image data that is inputted through the image data signal line 4.

A context is defined as a vector consisting of a string of pixel values, where each position of the pixel is specified by the template. For the template in FIG. 15($a$) where the meshed square is the noticed pixel position and p1 to p4 are reference pixel positions, respectively, each pixel value for pixel position p1 to p4 in FIG. 15($d$), for example, is shown as p1=0, p2=1, p3=1 and p4=1, respectively. So that, the vector consisting of a string of these values, <0111>, becomes the context in this case.

Figure 15:
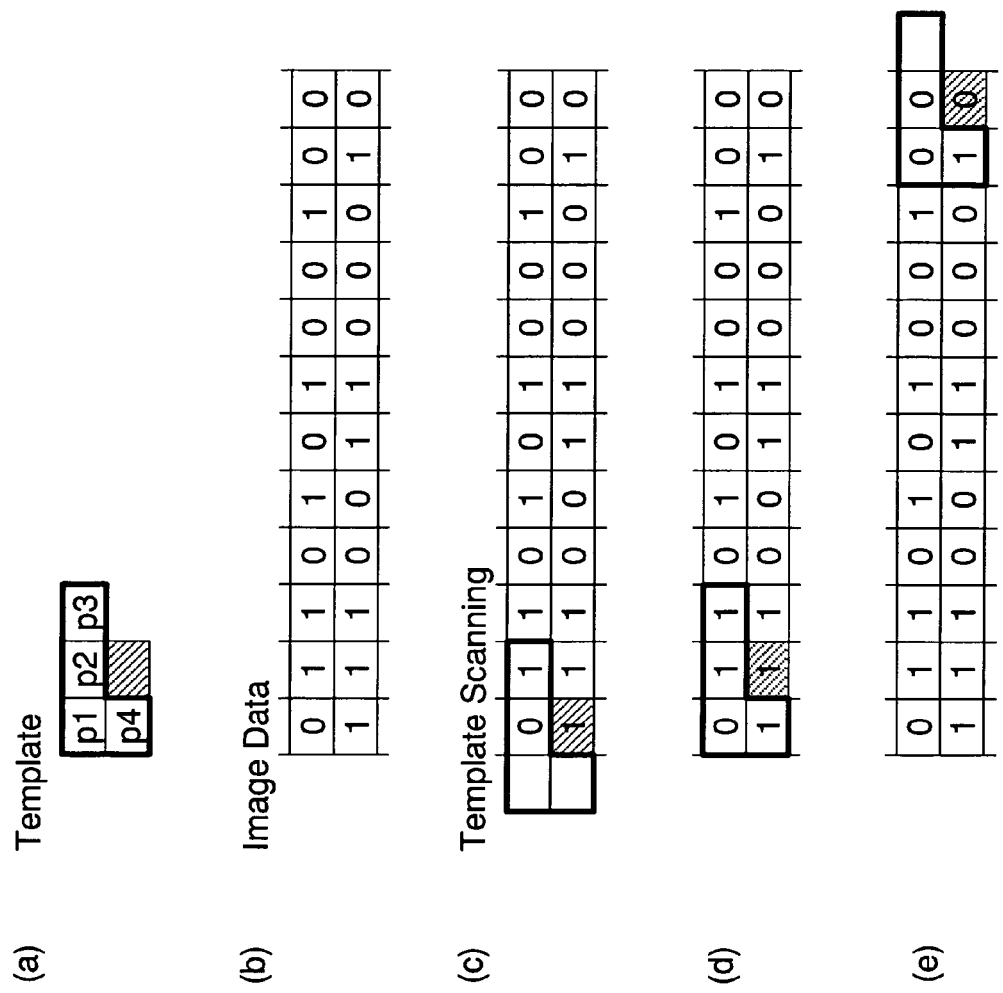
FIG. 15 is a modeling figure to show how to calculate the co-occurrence probability density.

It is possible to expedite processing speed of the context generator by using a shift register. In the template of FIG. 15($a$), for example, pixel positions p1, p2 and p3 are set in a line in this order. When this template is shifted to the right by one bit, then the value of position p2 comes to position p1, and the value of position p3 comes to position p2. This means that pixel values that should be newly inputted from the memory are only pixel values for p3 and p4, if a three-bit shift register corresponding to p1 to p3 is used to express a part of template. Consequently, it becomes possible to speed up the processing time since memory address calculation times are reduced.

The compression coder 11 carries out compression coding of image data that are inputted through image data signal line 4 by using the context inputted through the context signal line 10, in order to generate the compressed data.

The compression-coded data combiner 13 adds the template that is used to generate said compressed data and the block information that is used as the basis of compression coding to the compressed data, so as to generate the compression-coded data 15. For this purpose, the compression-coded data combiner 13 receives the block information through the block information signal line 7, the template through the template signal line 9 and the compressed data through the compressed data signal line 12, respectively. It is also possible to input attribute information concerning the image data (image resolution, the line number used, the screen angle, the name of the system that has generated the data and its version number, the date of generating the image data, etc.) from an outside apparatus to the compression-coded data combiner 13 through the attribute information input line 18, in order to record them in the header portion of the compression-coded data 15.

Processes beginning by image data compression and finishing by output of the compression-coded data 15 are simply explained in the following, referring to FIG. 6.

First, the attribute information concerning the image data are inputted from an outside apparatus to the compression-coded data combiner 13 through the attribute information input line 18, and recorded in the header of the compression-coded data, although this attribute information input is not mandatory.

Next, the image data 1 to be compressed is inputted to the image buffer 3 through the image data input line 2. The image data 1 is then transferred to the block decider 6 through the image data signal line 4. Since the size of the image (vertical and horizontal sizes) can be known after this transfer, this size information is sent to the compression-coded data combiner 13 through the block information signal line 7, and then recorded in the header of the compression-coded data 15.

The way of how to divide the image into blocks is calculated by the block decider 6. It is not necessary to calculate the optimum way of division by the block decider if divided blocks are already determined as is the case of character blocks or photograph blocks in a newspaper space, for example. The processing speed can be expedited in this case, by inputting the space configuration information to the block decider 6 through the block decider control information line 17. Otherwise, higher compression efficiency can be expected if more detailed block division is carried out by using the space configuration information as the basis of the division. This method is explained in detail later.

Figure 1:
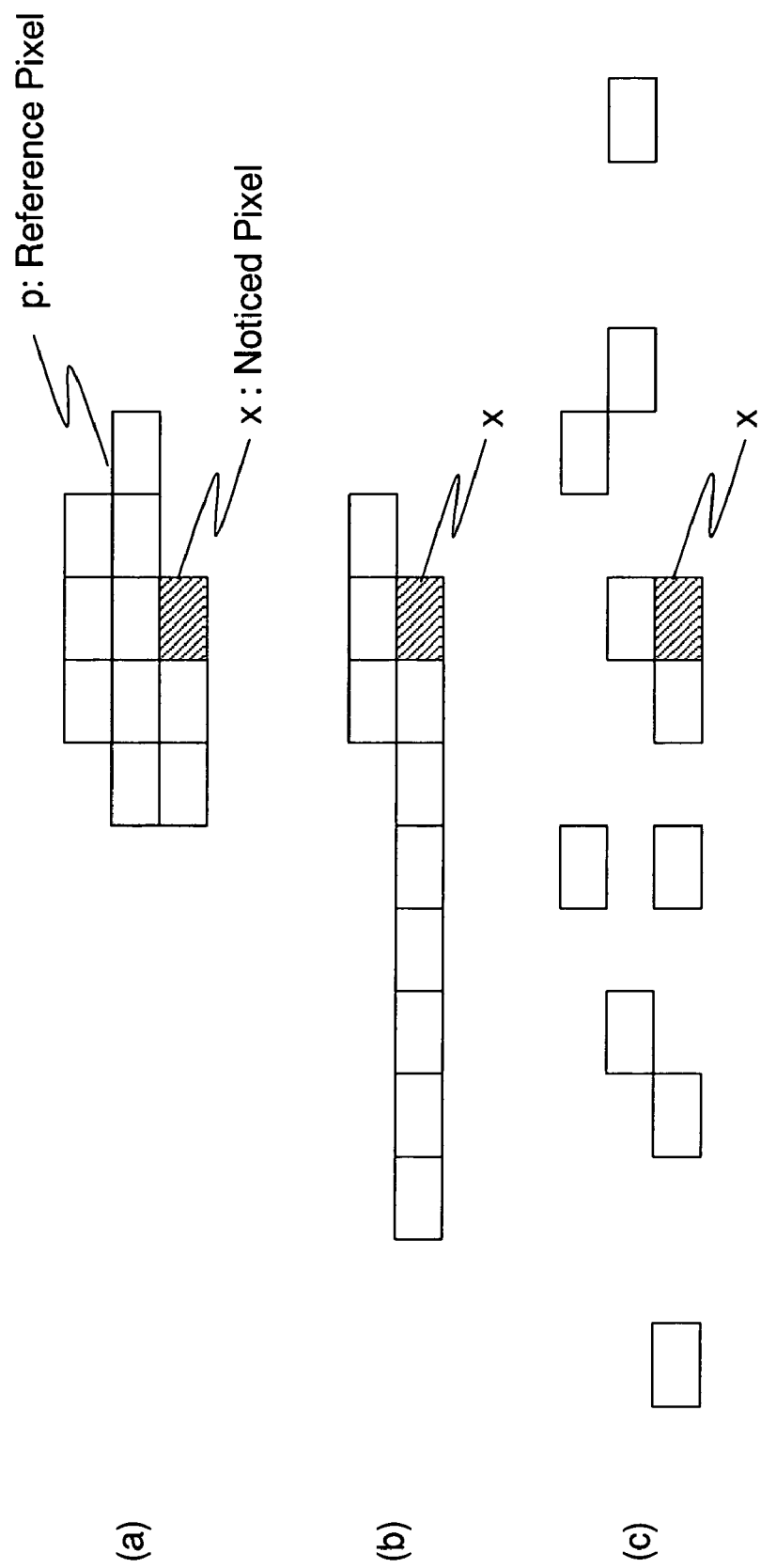
FIG. 1 is a figure to explain examples of conventional templates.
Figure 2:
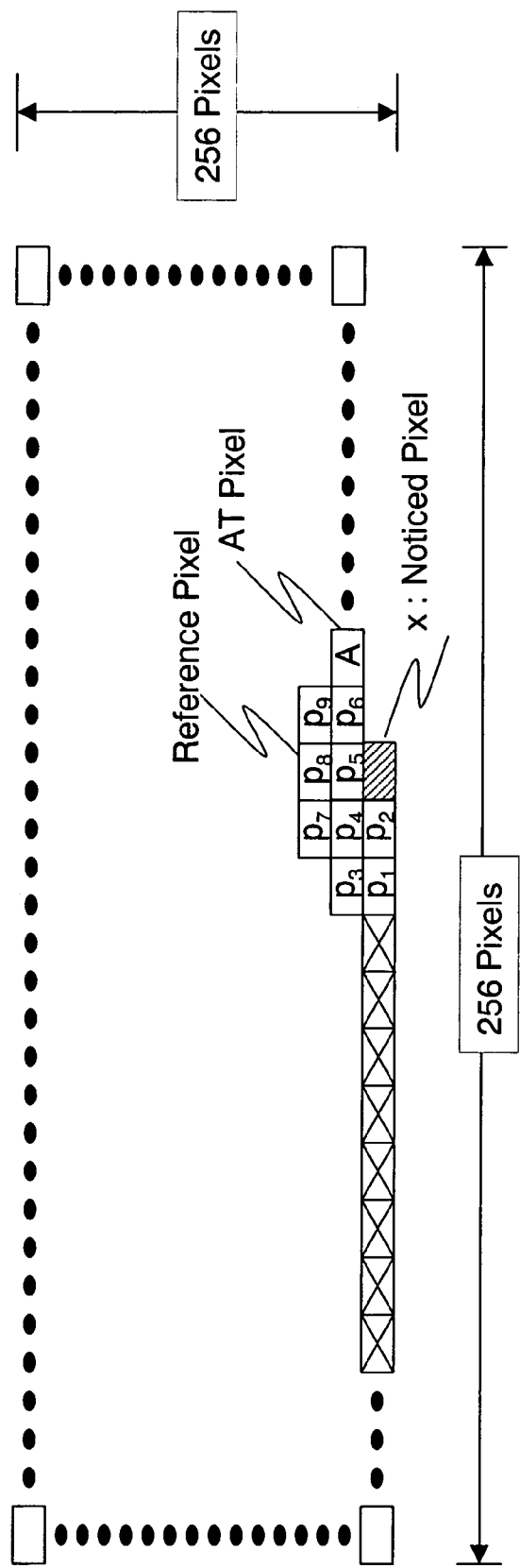
FIG. 2 is a figure to explain the template that is used for the JBIG coding method.

The block division information determined by the process explained above is sent to the image buffer 3, and the image data is then sent to the template generator 8 by each block. In the template generator 8, the optimum template is calculated for each block according to the process flow chart shown in FIG. 8. This calculation process is explained later. It is not necessary to optimize the template for a character area where characters with a small font are crowded, since it is already known that the template with the configuration where reference pixels are crowded around the noticed pixel, as shown in FIG. 1(*a*), works effectively in this case. Thus, in such a case where the optimum template is already known as mentioned above, the template is unilaterally determined by the template generator control signal that is conveyed on the template generator control signal line 16.

In the context generator 5, the respective context is extracted for each pixel during scanning the block-divided image data that is sent from the image buffer 3 through the image data signal line 4, by using the template that is determined by the template generator 8.

In the compression coder 11, the compressed data is generated by using each pixel of the block-divided image data that is sent from the image buffer 3 through the image data signal line 4, and by using each context that is obtained through the process explained above.

The obtained compressed data is sent to the compression-coded data combiner 13 through the compressed data signal line 12, combined with the block information that is sent from the block decider 6 through the block information signal line 7 and with the template that is sent from the template generator 8 through the template signal line 9, and then linked together as compression information for each block so as to be outputted as the compression-coded data 15 to the receiver side through the compression-coded data output line 14.

The compressed data generated by the compression coder 11 is sent also to the template generator 8 in order to be used in the compression rate calculation that is carried out in the process of template optimization by the template generator 8.

Figure 7:
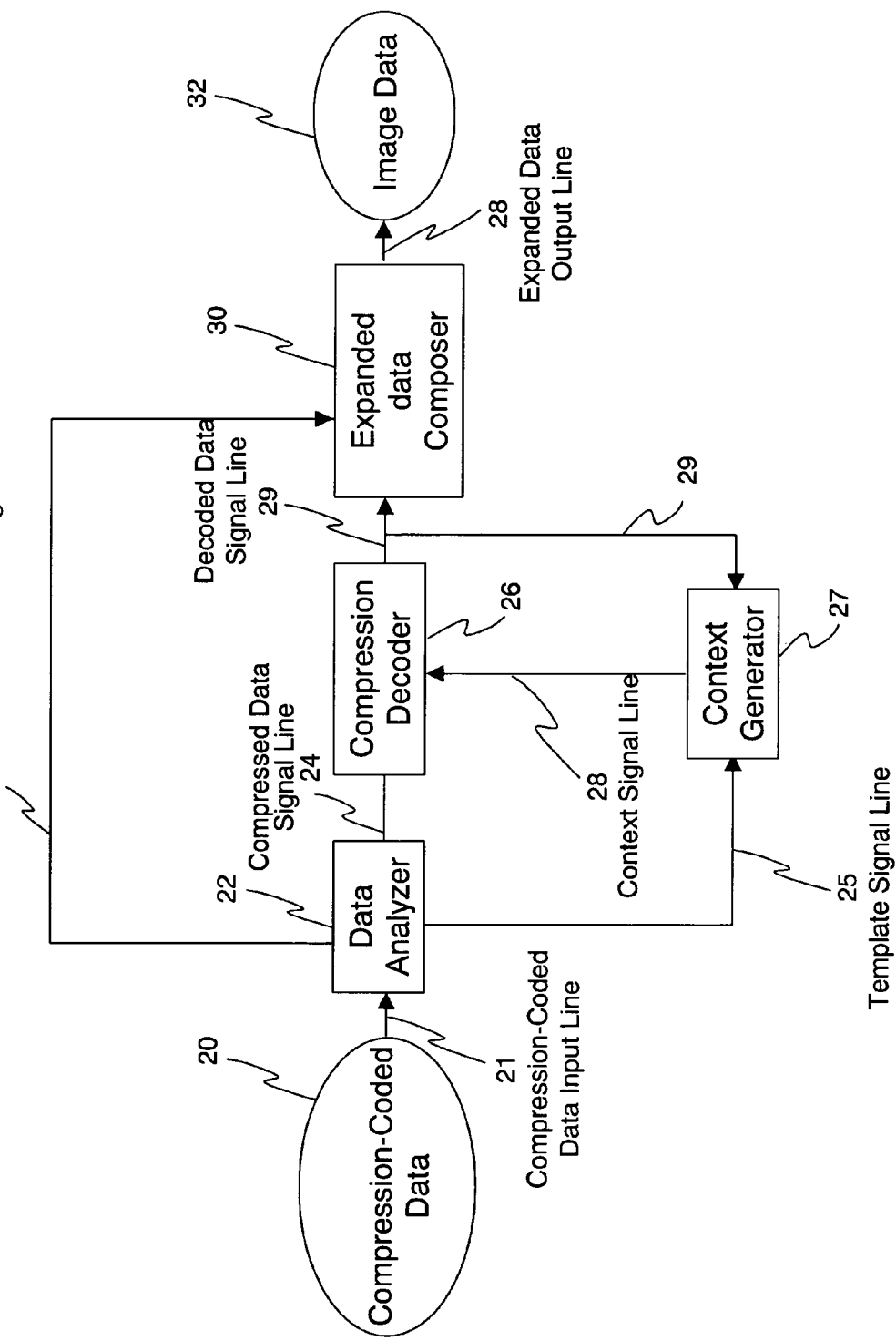
FIG. 7 is a block diagram of the receiving side of the image transmission system in the embodiment example of this invention.

FIG. 7 shows a block diagram of the receiving side of the image transmission system in the first embodiment example of this invention. The data analyzer 22 separates the compression information (the block information, the template and the compressed data) of each compressed block and the header portion from the compression-coded data 20 that is inputted through the compression-coded data signal line 21, and then outputs the template and the compressed data according to the block information.

The context generator 27 recovers the pattern of reference pixel values (the context) in the decoded data that is inputted through the decoded data signal line 29, by using the template that is inputted through the template signal line 25.

The compression decoder 26 decodes the compressed data inputted through the compressed data signal line 24 to obtain the decoded data, by using the context that is inputted through the context signal line 28.

Since the compression decoder 26 outputs the decoded data that is divided into blocks piecewise like a patchwork, it is necessary to re-configure these blocks in correct order so as to recover the original image. For this purpose, the expanded data composer 30 receives the decoded data from the compression decoder 26 via the compression data signal line 29, and configures the inputted decoded data blocks by using the block information that is sent from the data analyzer 21 through the block information signal line 23 in order to compose the expanded data that is to be outputted to an external apparatus through the expanded data output line 28.

Processes beginning by compression-coded data input and ending by output of the expanded data are shortly explained in the following, referring to FIG. 7.

Figure 24:
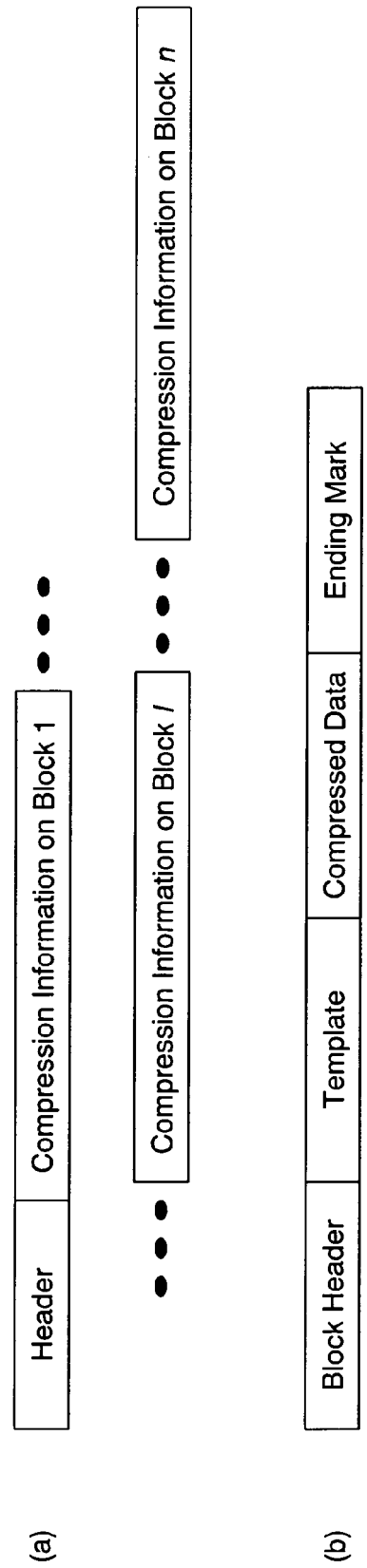
FIG. 24 is a modeling figure to show a data formatting example after compression coding.
Figure 25:
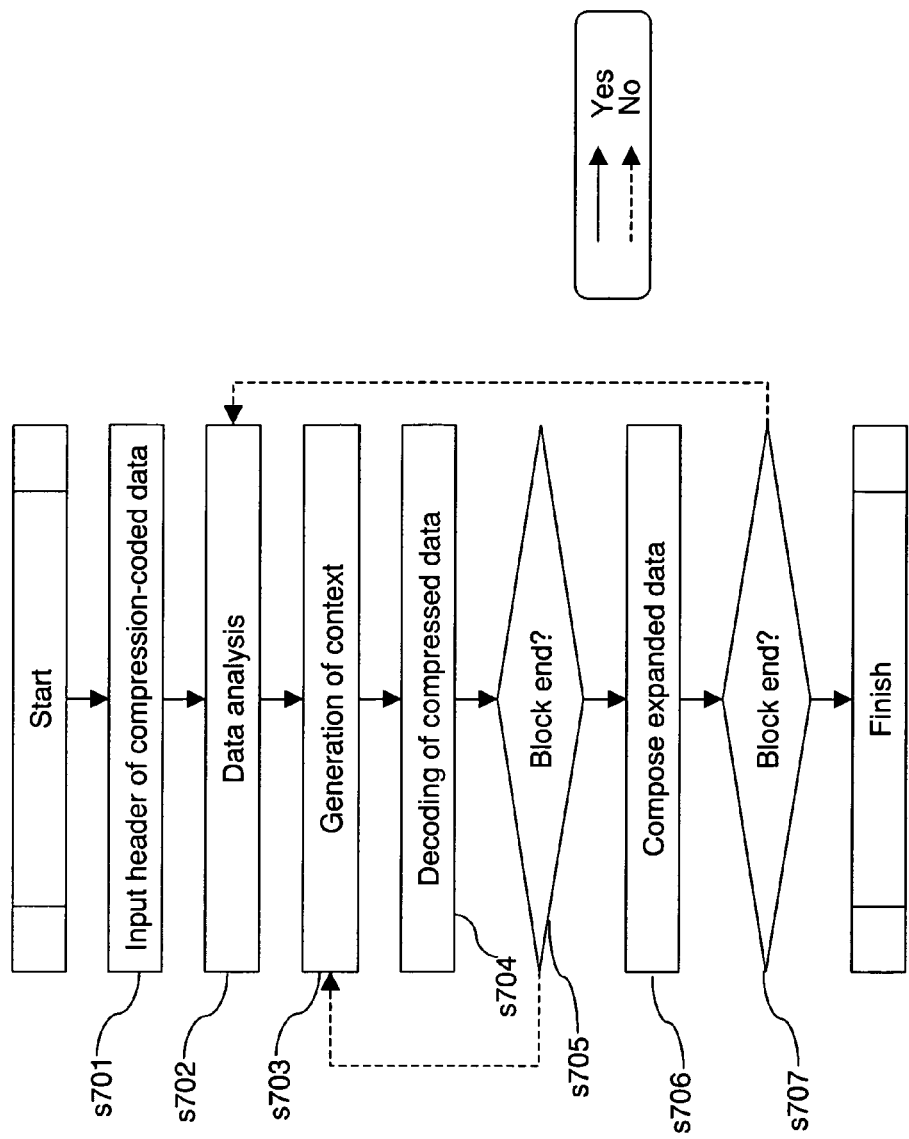
FIG. 25 is a flow chart to show the operation procedure of the decoding program.

First, the compression-coded data 20 enters in the data analyzer 22 through the compression-coded data signal line 21. The detailed format of the compression-coded data 20 is explained later by using FIG. 24. The data analyzer 22 analyzes the compression-coded data 20 and extracts the header portion and the compression information (the block information, the template and the compressed data) separately.

The attribute information of the original image that is recorded in the header portion is sent to the expanded data composer 30 and used as the header of the expanded data as it is. Since the size of the original image (vertical and horizontal sizes) is always recorded in the header portion also, the expanded data composer can recover the complete original image data as the expanded data, by using this size information.

The compressed data is sent from data analyzer to the compression decoder 26 through the compressed data signal line 24, while the template corresponding to said compressed data is sent to the context generator 27 through the template signal line 25. The compression decoder 26 receives the context from the context generator through the context signal line 28, decodes the compressed data by using this context and then outputs the decoded data through the decoded data signal line 29. The decoded data is sent to the context generator 27, where the context is regenerated from the decoded data by using the template.

The expanded data composer 30 inputs the decoded data from the compression decoder 26 through the decoded data signal line 29, and re-configure the decoded data that is divided into blocks like a patchwork, in order to compose the expanded data as the recovered original image data. The expanded data is outputted to an external apparatus through the expanded data output line 28.

Figure 34:
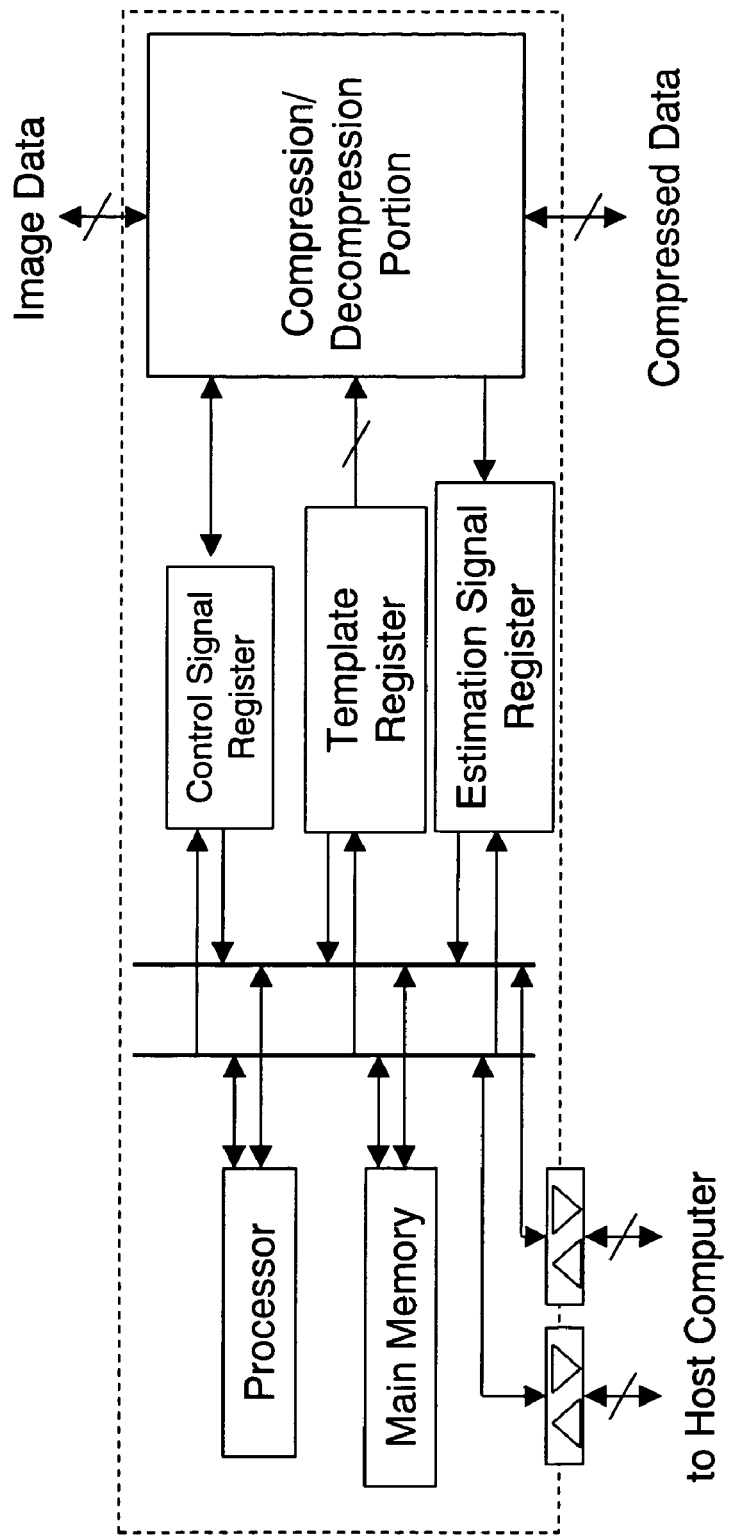
FIG. 34 is a block diagram of the image data compression hardware.

FIG. 34 shows an example of realizing the core technology of this invention using hardware. The image data compression hardware using the technology of this invention consists of a processor, the main memory, several registers and the compression/decompression portion. Functions of each element in the image data compression hardware in case of image compression are explained in the following. The processor decides block division, generates template and interfaces with the host computer. The main memory stores the program for block division decision, the program for template generation and the template that is found out. Each register is used for interfacing between the processor and the compression/decompression portion. The compression/decompression portion generates the context, carries out compression coding and composes the compression-coded data. Composition of the compression-coded data may be carried out by the external computer, otherwise.

Functions of each element in the image data compression hardware in FIG. 7 in case of data decompression is explained in the following. The processor is used almost only for data analysis of the data header portion of the compressed data and for interfacing with the host computer, in case of data decompression. As is similar to the data compression case, the main memory stores the data analyzing program that is carried out by the processor. Each register works as the interface between the processor and the compression/decompression portion. The compression/decompression portion regenerates the context, carries out compression decoding and composes the expanded data. Composition of the expanded data may be carried out by the external computer, otherwise.

Operation of the image data compression hardware using the technology of this invention mentioned above is explained next in the following. Firstly at beginning compression, information such as the size and resolution of the image that is to be compressed and that is stored in the host computer is sent to the processor and the compression/decompression portion in the image data compression hardware. The compression/decompression portion records such information data as mentioned above in the header portion of the compression-coded data. The processor decides the block division way and optimize the template by using the information data, through cooperation with the compression/decompression portion.

Figure 8:
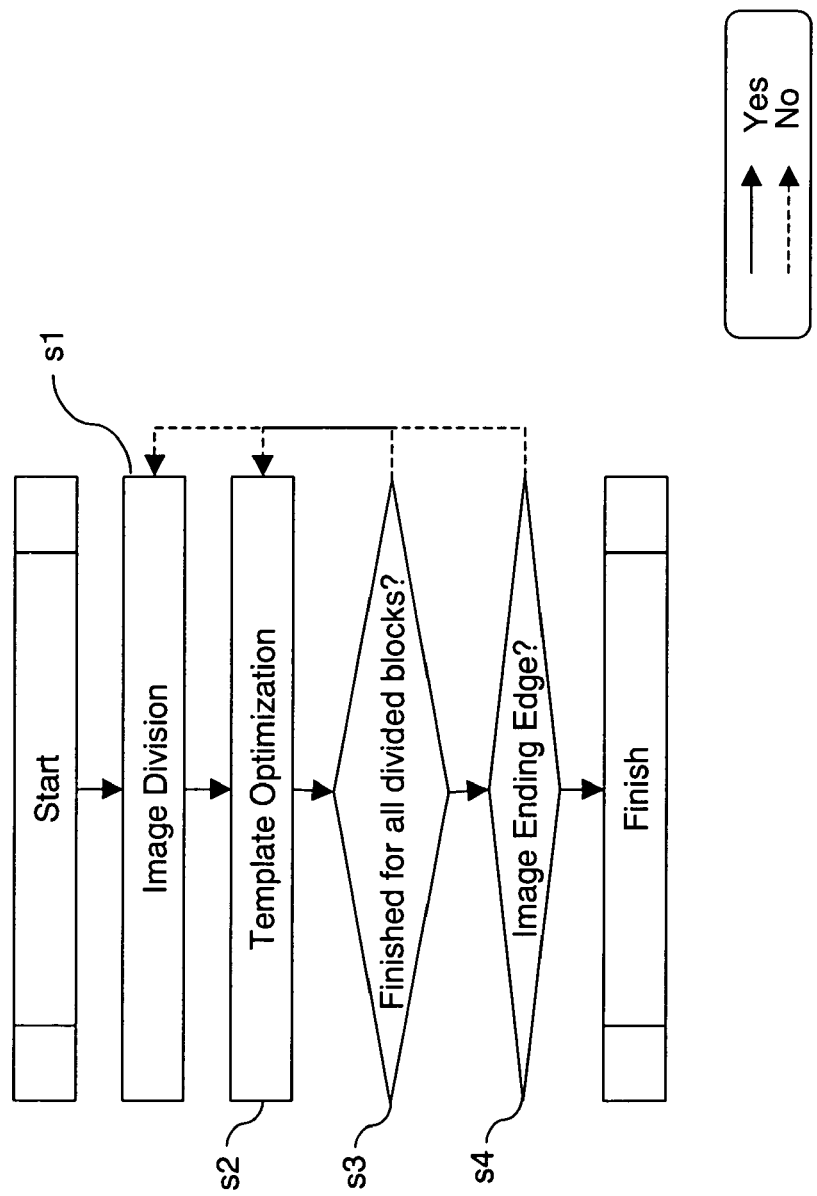
FIG. 8 is an operation flow chart of the template optimization process in the embodiment example of this invention.

FIG. 8 shows a flowchart of operation procedures for the adaptive template optimization method of this invention realized by software. General flow of the procedures is explained first, and then details for each procedure will be explained.

The image division step s1 is carried out first for the input image data in preparation for compression coding by each area having a similar feature. Division of the whole image into blocks at one stage and may be one choice and this is considered as two-path processing, while processing where a part of the image is once divided into blocks and the remaining portion of the image is divided into blocks later may be the other choice and this is considered as one-path processing. The latter processing is explained here.

Once a portion of the image is divided into a plural number of blocks, then the template optimization step s2 for each divided block is carried out. After template optimization is finished for all of divided image blocks that are generated by the step s1, division into blocks for remaining image portion and template optimization for each divided block are carried out until the process reaches the ending edge of the image.

Figure 9:
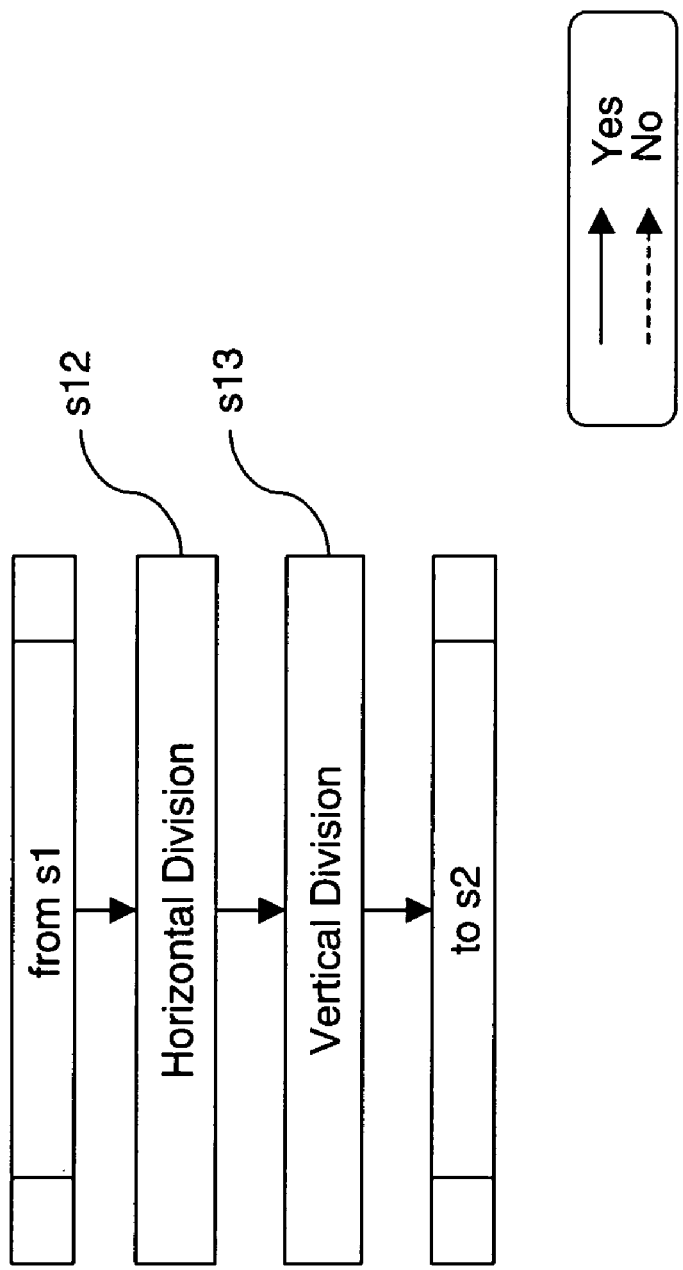
FIG. 9 is an operation flow chart of the image division process in the embodiment example of this invention.

FIG. 9 shows the image division process (s1) for block decision. In the horizontal division step s12, image data is inputted recurrently line by line into the image memory of the compression/decompression portion shown in FIG. 35, until the processor detects the ending edge of the block. Detection of the block ending edge is carried out as shown in the following.

Figure 10:
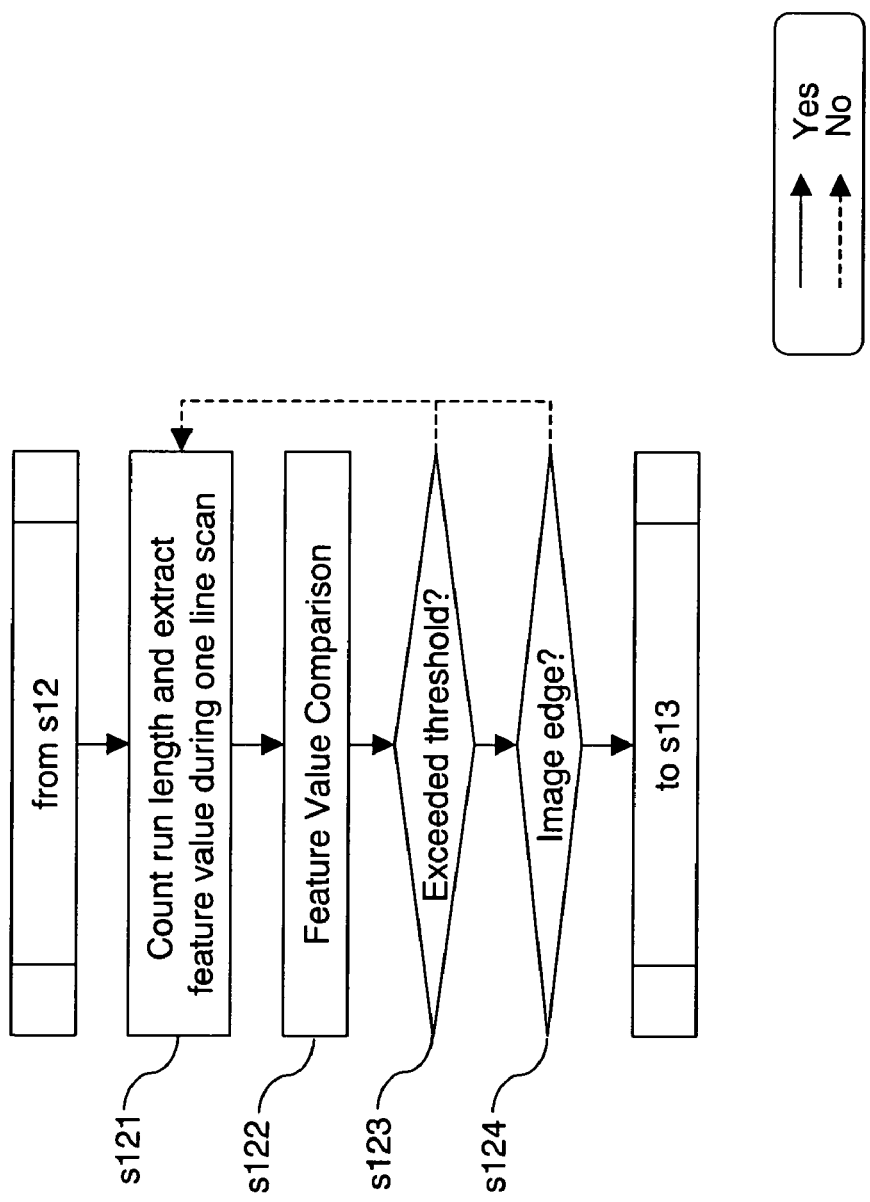
FIG. 10 is an operation flow chart of the process for the block division in the horizontal direction.

FIG. 10 shows the flow chart of the horizontal division step s12. In the step s121, all of the run lengths that are the numbers of continued pixels with the same color are recorded during the recurrent line by line image scan. At the same time, the feature value of the line under scan is calculated. The recorded run lengths are used for division in the vertical direction, and the feature value is used for division in the horizontal direction. The average run length or the KL (Kullback-Leibler) information volume based on the simultaneous probability density (probability for every pixel that can be referred to take the same value as the noticed pixel) is used as the feature value.

Next, the feature value of the presently noticed line and the feature value of the line just before the presently noticed line are compared (s122). If the difference between them exceeds a predetermined value, then a decision is made that lines up to just one line before the noticed line belong to the same block. Detection of the block ending edge is thus carried out. When the line scanning reaches the image ending edge, this edge becomes the block ending edge even the decision threshold is not exceeded.

Here, the simultaneous probability density is explained in detail by using FIG. 15. Let four pixels, p1 to p4, in FIG. 15(a) be all the pixels that can be referred, and the meshed square in the same figure be the noticed pixel. Also, let the second line in FIG. 15(b) be presently noticed line. In order to obtain the simultaneous probability density, the probability for each reference pixel to take the same value as the noticed pixel is first calculated by scanning the noticed line, as FIG. 15(c) to FIG. 15(e) show. In FIG. 15(c), only the pixel p3 has the same value as the noticed pixel. Reference pixels p1 and p4 are considered as not taking the same value as the noticed pixel, since they are out of the defined data area. In the similar way, p2, p3 and p4 in FIG. 15(d), and p1, p2 and p3 in FIG. 15(e) have the same value as the noticed pixel. Consequently, after scanning is made for the noticed line from FIG. 15(c) to FIG. 15(e), each number of times for each of reference pixels, p1 to p4, to take the same value as the noticed pixel becomes 7, 7, 7, and 6, respectively. These values are divided by the total number of times, 27, for normalization in order to obtain the simultaneous probability density for each reference pixel, which results in 7/27, 7/27, 7/27 and 6/27, respectively.

Calculation procedure of the KL information volume based on the simultaneous probability density is explained in the following. Let $x_i$ and $y_i$ be the information volume of the noticed line and the information volume of the line just before the noticed line, respectively, then the KL information volume, $KL_D$, is expressed as;

$$KLD = KL(x) + KL(y),$$

here, $$KL(x) = \Sigma\{X_i \times \log(X_i/Y_i)\},$$

and $$KL(y) = \Sigma\{Y_i \times \log(Y_i/X_i)\}.$$

More accurate feature comparison can be possible, if not only the feature value of the line just before the noticed line but also the feature values of all lines from the line of the block starting edge to the line just before the noticed line are calculated, and the average, the moving average or the weighted average of these feature values is used, instead of the simple feature value of the line just before the noticed line, for the comparison with the feature value of the noticed line.

As the measure of feature comparison, the Minimum Description Length (MDL) standard, the Akaike's Information Criterion (AIC) or the distance between vectors can be used instead of the KL information volume.

In order to expedite calculation speed, it is possible to calculate feature values only for reference pixels in the template that is used for the block just before the present block, instead of calculating feature values for all pixels that can be referred.

Figure 11:
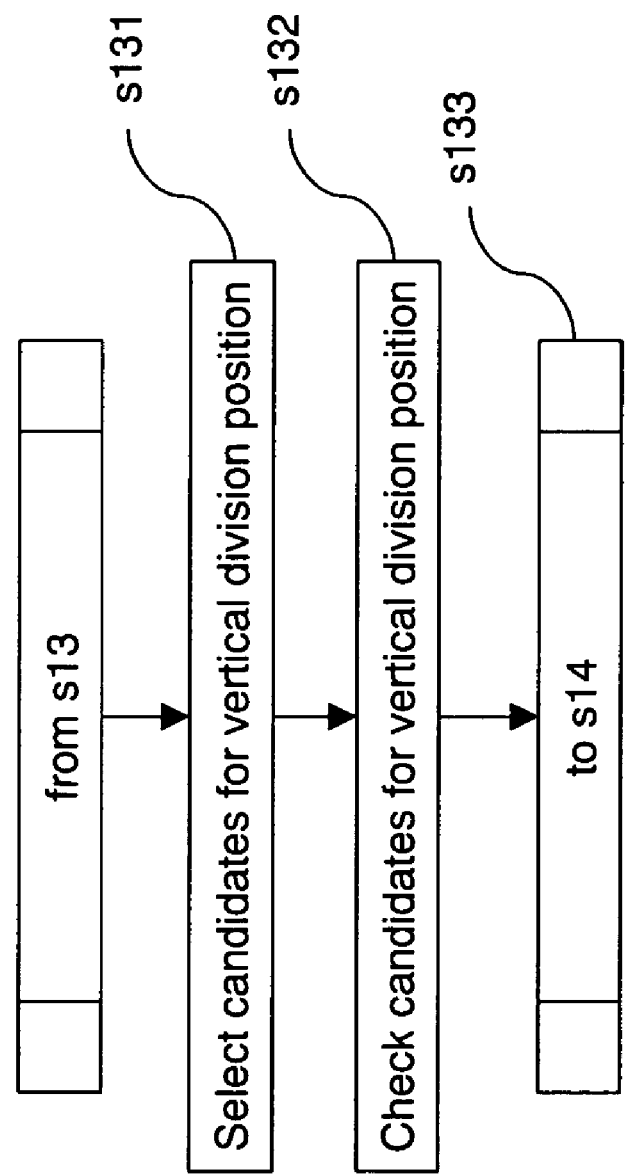
FIG. 11 is an operation flow chart of the process for the block division in the vertical direction.

After the block border in the horizontal direction is detected, the block can be further divided in the vertical direction. FIG. 11 shows the procedure of the division in the vertical direction (s13).

At the step s131, candidates for vertical division position are selected first. By referring to the run lengths of the same color in each line that have been recorded at the step 121, candidates for vertical division position can be selected for each line.

Figure 33:
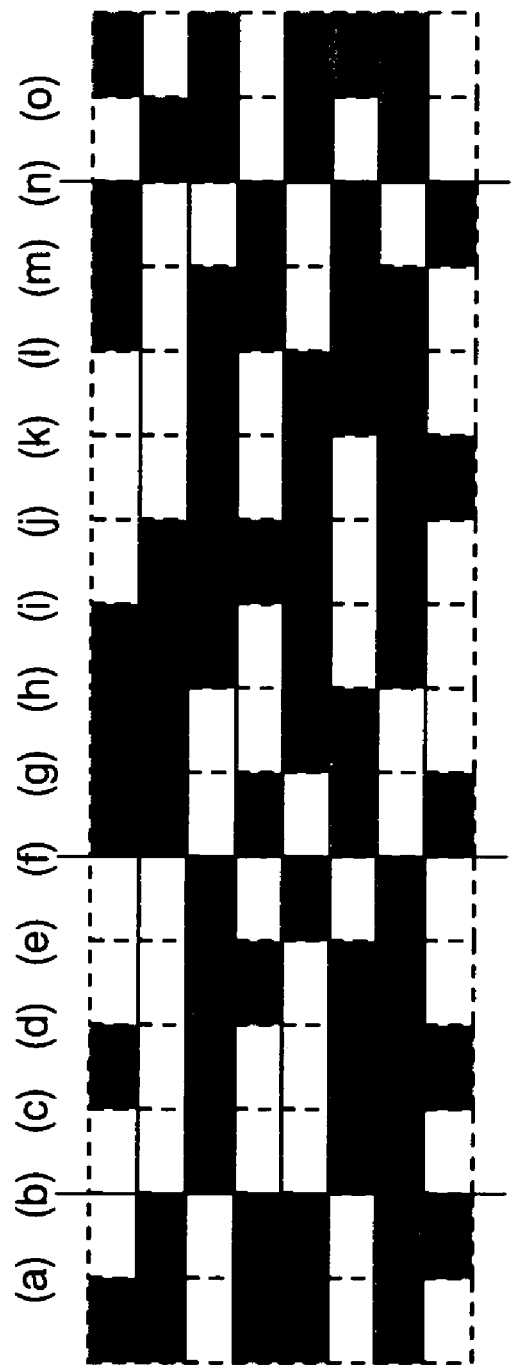
FIG. 33 is a modeling figure to show how to decide the vertical division candidate.

FIG. 33 shows an example of an image block with the width of 16 pixels and the height of 8 lines. In the top line, eight positions of (a), (c), (d), (f), (i), (l), (n) and (o) are candidate positions for vertical division. Similarly, four positions of (b), (f), (j) and (n) become the candidate positions for vertical division in the second line. By repeating similar procedure for all other lines, candidate positions for vertical division can be selected for each of all lines.

Next, in the step s132, each of all selected candidate positions is checked whether it is to be used as an actual vertical division position or not. A method similar to the decision by majority is used for this purpose. Let a predetermined standard rate be 0.8 as the threshold for selection. Seven lines among eight lines in FIG. 33 have a break of a run at position (b). This means that ⅞, or higher than 0.8, of all lines support the vertical division position of (b), so that (b) is selected as the actual vertical division position for the noticed block. Similarly, (f) and (n) are selected as actual vertical division positions for the block, because all lines have the break of a run at these positions (the rate for selection decision is 1.0).

Although the minimum run length is 1 and candidate positions for vertical division are selected as the break of run with the run length larger than 1 in the above example, the minimum run can be set as a larger value than 2. As the minimum run length becomes smaller, the number of vertical division becomes larger, since the sensitivity of selecting vertical division positions among candidates becomes higher. Inversely, as the minimum run length becomes larger, the number of vertical division becomes smaller, since the sensitivity of selecting vertical division positions among candidates becomes lower. Actually in the above example, vertical division does not occur when the minimum run length is set to a value larger than 2.

It is possible to install a dedicated calculation unit in the compression/decompression portion in FIG. 34 and to carry out block decision through horizontal and vertical block division by this unit, instead of doing this calculation by the processor in FIG. 34.

Figure 28:
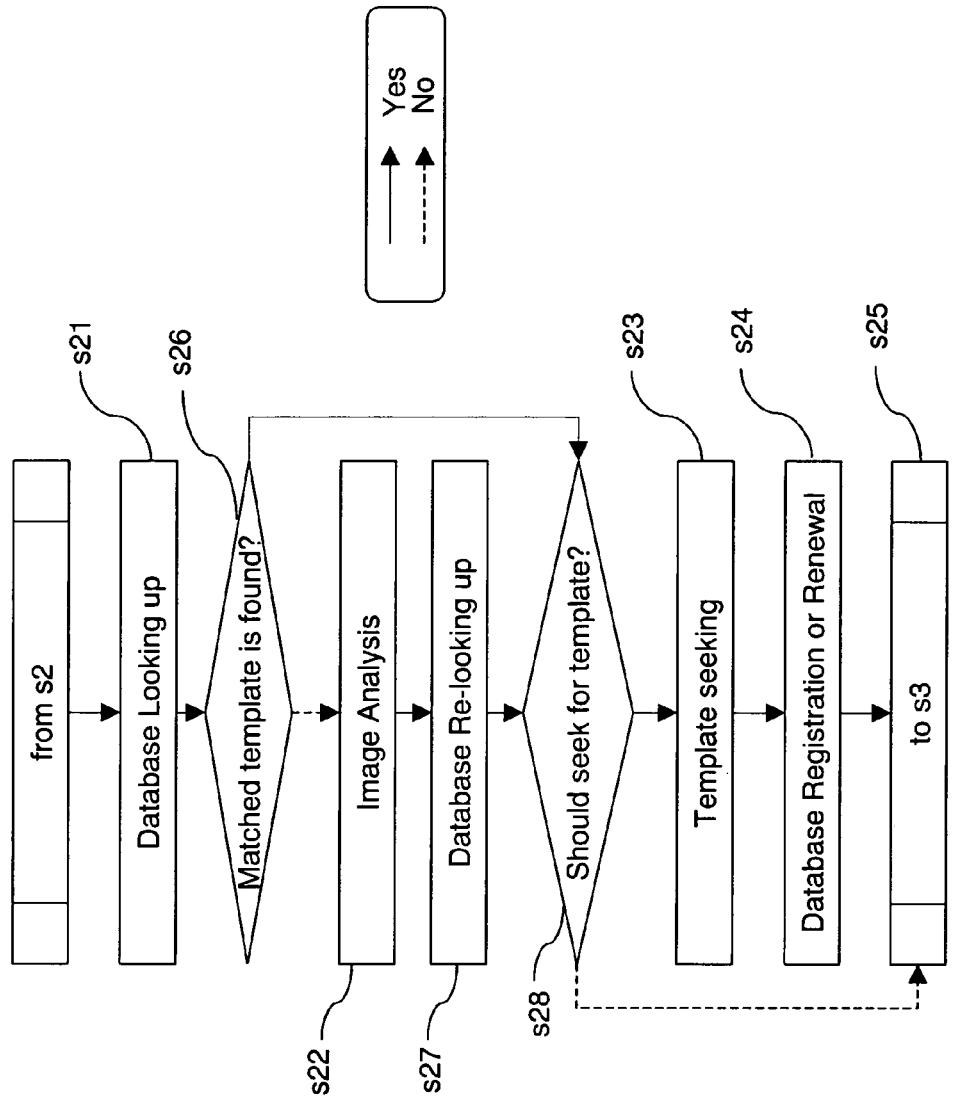
FIG. 28 is a flow chart to show the operation procedure of template optimization.

Template optimization for each block (s2) is carried out after the block decision procedure is finished. The calculation procedure of the template optimization is shown in FIG. 28.

First, the database is looked up at the step s21 in the figure for an appropriate template. In addition to the templates that have been registered in advance for each block, the template that is obtained for each block by the seeking that will be explained later is also recorded in the database in the memory 8M shown in FIG. 6.

If a pre-registered template for the block is found as appropriate at the database looking up, the procedure jumps to the step s28 (s26). If no appropriate registered templates can be found at the database looking up, then the procedure goes to the image analysis step s22. At this step, a template that is suitable for the image data is obtained by a statistic process or by a simple equation calculation referring to data features such as periodicity. Then, by using this template obtained by the step s22 as the key for looking up, the database is looked up again (s27). No matter whether the looking up result is that the same template is recorded in the database or not (s27), the procedure goes to the step s28 where decision is made whether the seeking for the optimum template should be carried out or not.

At the step s28, decision is made whether the seeking for the optimum template should be carried out or not. The criterion of this decision is explained later. If the decision that the template seeking should not be carried out, then the procedure goes to the step s25 and the template optimization is finished.

At the step s23, template optimization by using an exploratory method based on Artificial Intelligence is carried out. Finally, the template obtained by the template seeking is stored in an appropriate area of the database. The stored template is used at the database looking up that is already explained, in order to obtain a template with higher accuracy at higher speed.

The template optimization procedure explained above is carried out for all of divided image blocks that have been generated by the block division procedure that is already explained. It is possible to carry out template optimization only for some of divided image blocks as representatives and to simply apply the obtained templates for other divided blocks in order to expedite processing speed. It is also possible to omit the image analysis and the template seeking, if further expedition in processing is required.

Figure 29:
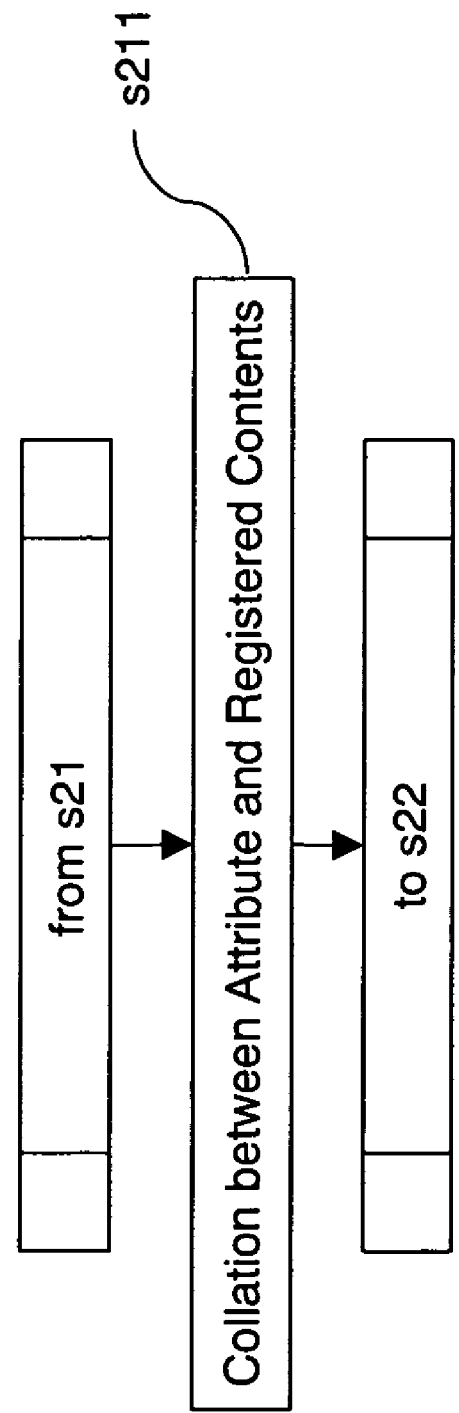
FIG. 29 is a flow chart to show the operation procedure of database look-up.

Each processing step in FIG. 28 is explained in detail in the following. FIG. 29 shows the processing flow at the step 21 of database looking up. The attribute information is collated with the registered contents at the step 211. FIG. 16 shows an example of the database structure of templates. The name of the system that has generated the image data to be coded, its version number, resolution of the image data, the line number and the screen angle are used as keys for looking up in this example, and a registered template of which attribute exceeds a prescribed threshold is selected as the appropriate template.

The image analysis result (the input template) in FIG. 16 is the key used for database looking up carried out again at the step 27 in FIG. 28, and is not used at this moment. If a template matched to the divided image block is found at the database looking up of the step s21, then the procedure jumps from the step 26 to the step 28 where a decision is made whether the template seeking should be done or not. The criterion of this decision can be (a) whether the compression rate is higher than a predetermined threshold or not, or (b) whether the sum of the correlation amplitude (this term is explained later) of each pixel in the template is larger than the predetermined threshold value or not, as compared to the case where a standard template is used. Although the criterion (a) is used usually, the criterion (b) can be used for expediting the processing speed as much as possible.

The default template in JBIG and JBIG2 standard architectures is used as the standard template. The template that matched second best at the database looking up step, or the template finally adapted for a block already processed can be also used as the standard template.

At this decision step, it is possible to use an image that is cut out from a portion of the noticed block, or to use an image that is thinned out by line or by column from the original block according to a predetermined rule, in order to reduce the time required for calculation.

It is possible for an external system or an operator to decide forcefully whether the template seeking should be carried out or not.

If a decision is made that template seeking should be made, then template seeking is carried out at the step s23. If a decision is made that template seeking should not be made, then the procedure goes to the step s25 to finish the template optimization. Template seeking will be explained later in detail.

If no templates that satisfy the criteria are found, then the procedure goes to image analysis of the step 22 from the step 26.

Figure 30:
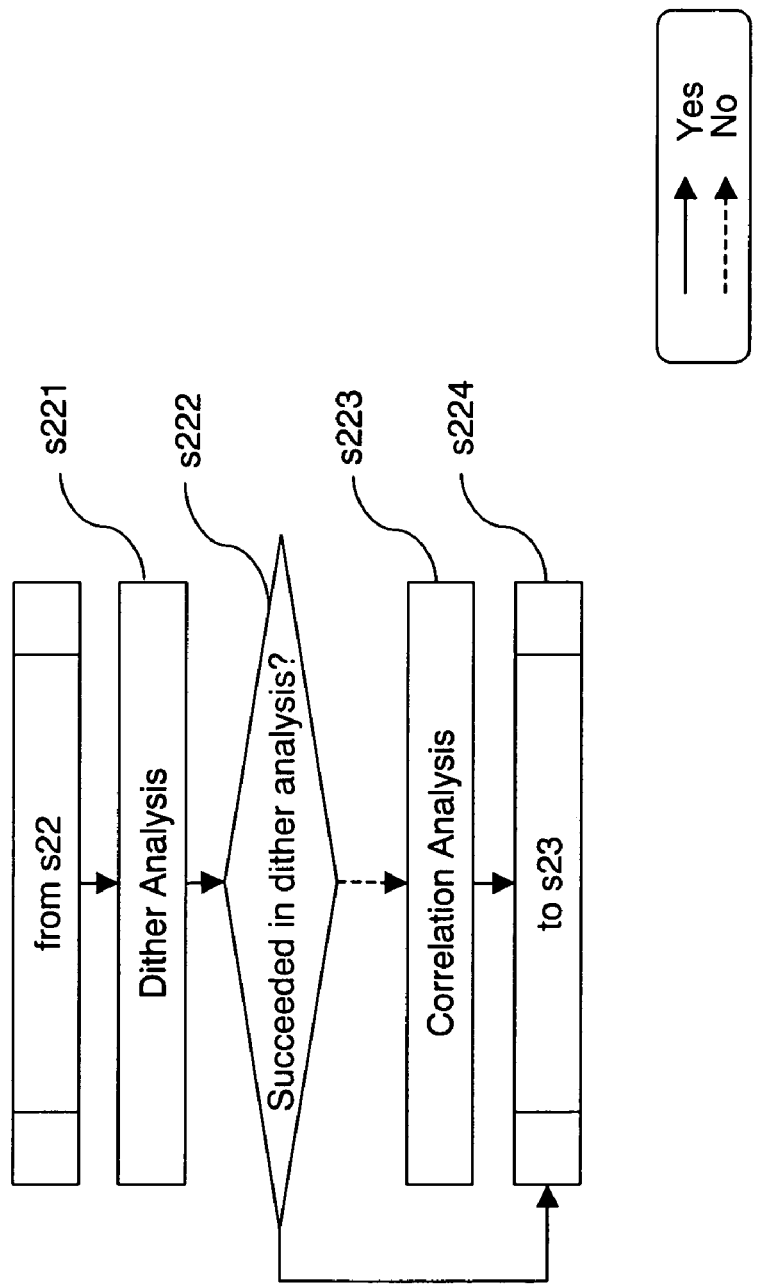
FIG. 30 is a flow chart to show the operation procedure of image analysis.

FIG. 30 shows the process flowchart of the image analysis. In the flow, dither analysis is tried first. If dither analysis succeeds, the image analysis process is terminated by this. If it didn't succeed, then correlation analysis is carried out to terminate the image analysis process.

Dither analysis utilizes the periodicity that arises from the dither matrix used for generating the dither image. The procedure of dither analysis is explained in the following. First, correlation amplitude between the noticed pixel and each of all pixels that can be referred is calculated. Next, a pixel that has the strongest amplitude of correlation with the noticed pixel is selected among pixels surrounding the noticed pixel with a distance larger than the predetermined value from the noticed pixel.

Figure 18:
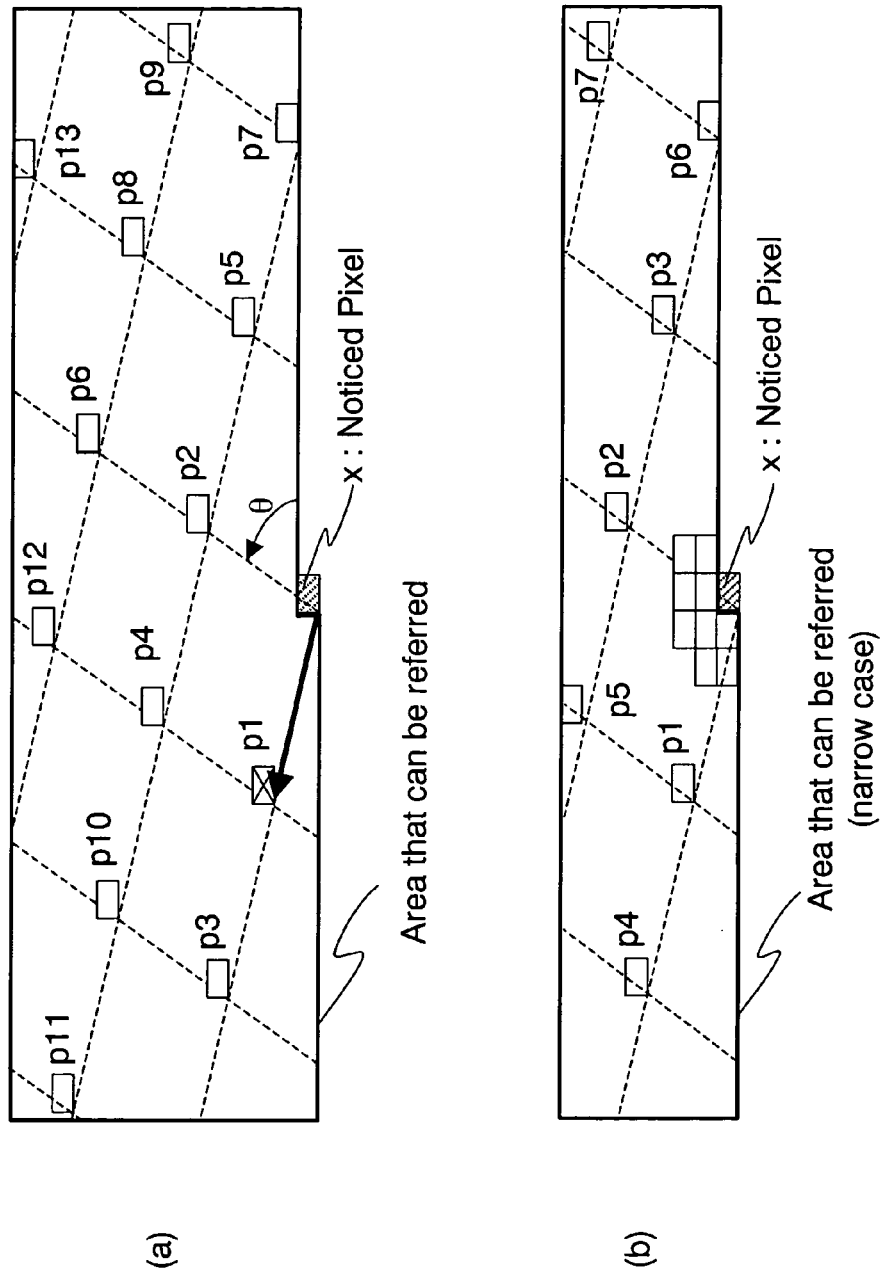
FIG. 18 is a figure to explain the operation principle of periodicity estimation that is carried out during the image analysis.

When the image to be coded is a dither image that is generated by using dither matrices, two pixels having strong amplitude of correlation between them are placed at vertices of squares with a specific side length and a specific angle to the scanning line, so that the probability is very high that the distance and the direction from the noticed pixel to a selected pixel satisfy the relationship shown by FIG. 18(a). In the figure, the hatched square is the noticed pixel, the crossed square is the pixel that has the strongest amplitude of correlation with the noticed pixel among pixels surrounding the noticed pixel with a distance from the noticed pixel larger than the predetermined value and blank squares are other pixels that are supposed to have strong amplitude of correlation with the noticed pixel from the relationship explained above. These pixels that have strong amplitude of correlation with the noticed pixel will be called "ideally placed pixels" hereafter. By selecting reference pixels out of these ideally placed pixels, more accurate template decision can be realized than using a reference pixel selection method based simply on correlation amplitudes of the pixels.

If "m", the number of ideally placed pixels existing in the area where the pixels within it can be referred, is larger than "n", the number of reference pixels that configures a template, then n-pieces are selected out of m-pieces of ideally placed pixels in order of smaller distance from the noticed pixel, so as to be utilized as the reference pixels that compose the initial template. For example, if the ideally placed pixels are configured as shown in FIG. 18(a) and n=10, then ideally placed pixels shown as p1 to p10 are selected as reference pixels.

Inversely, if "m", the number of ideally placed pixels existing in the area where the pixels within it can be referred, is smaller than "n", the number of reference pixels that configures a template, then reference pixels are selected from pixels adjacent to the noticed pixel and from pixels adjacent to the ideally placed pixels, in order of smaller distance from the noticed pixel. For example, if the ideally placed pixels are configured as shown in FIG. 18(a) and n=16, then ideally placed pixels shown as p1 to p13 are selected as reference pixels. Additionally, three more reference pixels are selected as reference pixels in order of stronger correlation amplitude with the noticed pixel, so that they complement the shortage in number.

When the area where the pixels within it can be referred to is too small to include enough number of ideally placed pixels, or when distances between each of ideally placed pixels are much larger than the scale of the area where the pixels within it can be referred, it is likely that reference pixels other than ideally placed pixels are all selected from the neighbor of the noticed pixels, since pixels that have larger amplitude of correlation with the noticed pixel generally exist near the noticed pixel.

FIG. 18(b) shows such an example of the area where the pixels within it can be referred is too small to include enough number of ideally placed pixels. In a case where the number "n" of reference pixels is 16, it is very likely that nine reference pixels other than the ideally placed pixels p1 to p7 are selected from the area close to the noticed pixel. There is a high possibility that the blank squares without suffixes near the noticed pixel in FIG. 18(b) are selected as reference pixels in order to complement the shortage in number of reference pixels. However, the resultant template cannot work effectively for a natural image, since the adopted reference pixels are gathering to close to each other.

In order to avoid such a situation as mentioned above, the template is determined through the process explained in the following. First, among pixels adjacent to the noticed pixel, the one having the largest amplitude of correlation with the noticed pixel is selected as a reference pixel. Next, ideally placed pixels are selected as reference pixels in order of larger amplitude of correlation with the noticed pixel. Then, pixels are selected among ones adjacent to each of the selected ideally placed pixels in order of larger amplitude of correlation with the noticed pixel. In the example of FIG. 18(b), fifteen (=1+7×2) reference pixels, that is, one pixel adjacent to the noticed pixel, seven ideally placed pixels and seven pixels adjacent to each of seven ideally placed pixels, are determined by the process up to this point. If number of selected reference point is still less than required for composing the template, then another reference pixel is selected from pixels adjacent to the noticed pixel, and further pixels next to each of ideally placed pixels are selected. The similar process as mentioned above is repeated until the total number of selected reference pixels reaches to the required value for composing the template.

In the dither analysis explained above, it is possible to reduce calculation time drastically by using simultaneous probability densities that have been already calculated at the image division process, instead of using correlation amplitudes.

Dither analysis is finished by finishing processes explained above. In a case where the dither matrices are known beforehand, calculation of ideal placement of pixels can be omitted, since periodicity and correlation patterns can be clearly obtained from the matrices.

If dither analysis cannot work effectively, correlation analysis is carried out at the step s223 in FIG. 30. Although usually all pixels that compose the divided image blocks are scanned in calculating correlation amplitudes, it is possible to reduce the processing speed by simplifying this calculation. This can be done by scanning only every pixel after several ones, by scanning only every line after several ones, or by scanning only a portion of the image region. For further expediting the calculation, scanning can be limited within a portion of the divided image block.

In the correlation analysis of the step s223, all amplitudes of correlation between the noticed pixel and each pixel within the area where the pixel can be referred are calculated. Then, n-pieces of pixels are selected from them in order of stronger correlation, to be used as the initial template when the template consists of n-pieces of pixels. The image analysis process is finished when this selection is finished.

If a selection criterion based simply on the correlation amplitude is used for an image with very strong high frequency components, the selected reference pixels are concentrated in the area around the noticed pixel, as shown in FIG. 1(a). It has been already stated that a template consisting of such reference pixels as these is effective for a character image, but is not effective for a natural image. Thus, it is necessary to scatter widely the position of reference pixels around the noticed pixel, while keeping using a method to select reference pixels simply from ones with strong correlation amplitudes.

One method to realize this requirement is explained by using FIG. 17(a). In the figure, the hatched square is the noticed pixel, blank squares are pixels with the correlation amplitude of zero (%) and squares with a number is pixels with the correlation amplitude of that number (%). In the example of FIG. 17(a), a template is assumed to consist of three reference pixels. In the case where reference pixels are selected by correlation amplitudes only, those pixels having correlation amplitudes of 100(%), 90(%) and 80(%) compose the template. A different template, however, can be generated if the correlation amplitude of a pixel adjacent to the one selected as a reference pixel is forcefully reduced by some amount at each selection.

For example, if the correlation amplitude of a pixel adjacent to the one selected as a reference pixel is forcefully reduced to 90% of its original value at each selection, then the status becomes as shown in FIG. 17(b) after two pixels with correlation amplitudes of 100(%) and 90(%) are selected. That is, the correlation amplitude of the pixel with its original correlation amplitude of 80(%) is reduced to as low value as $80 \times 0.9 \times 0.9 = 64.8$ (%), after the selection of the two reference pixels. Thus the third reference pixel to be selected should be the pixel with the correlation amplitude of 70 (%) in the figure.

In the correlation analysis explained above, it is possible to reduce calculation time drastically by using simultaneous probability densities that have been already calculated at the image division process, instead of using correlation amplitudes.

The fact that a template that matches to the image analysis result (input template) as the looking up key has been already registered in the database means that the compression process has been carried out before for image data that has very similar statistic features to those of the image data that is currently going to be compressed. In other words, by using the registered template that was obtained by the past template seeking, it becomes possible to use the more effective template than the one obtained simply as the image analysis result for the present image data, without wasting time for seeking a new template.

Although the probability that the template that was effective for an image is also effective for another image that have very similar image features is high, it cannot be always assured. For example, in a dither image processed by the error diffusion method, reference pixels decided by the statistic method tend to crowd around the noticed pixel as shown in FIG. 1(a) regardless of picture patterns. So that, in case such situation mentioned above is expected to occur, the situation can be avoided by setting beforehand the threshold for the matching decision in the database looking up process at a higher value. Or otherwise, if the threshold is set to a different value corresponding to each of different dither methods, the above-mentioned issue can be solved automatically.

Explanation for the image analysis of the step s22 in FIG. 28 finishes here, and database re-looking up of the step s27 in the figure will be explained next.

Differently from the database looking up of the step s21, only the image analysis result (the input template) is used as the key for the look up (see FIG. 16), and a registered template that satisfies the predetermined threshold is outputted.

After the database re-looking up is finished, a decision whether the template seeking should be carried out or not is made at the step 28, which procedure has been explained heretofore.

Figure 31:
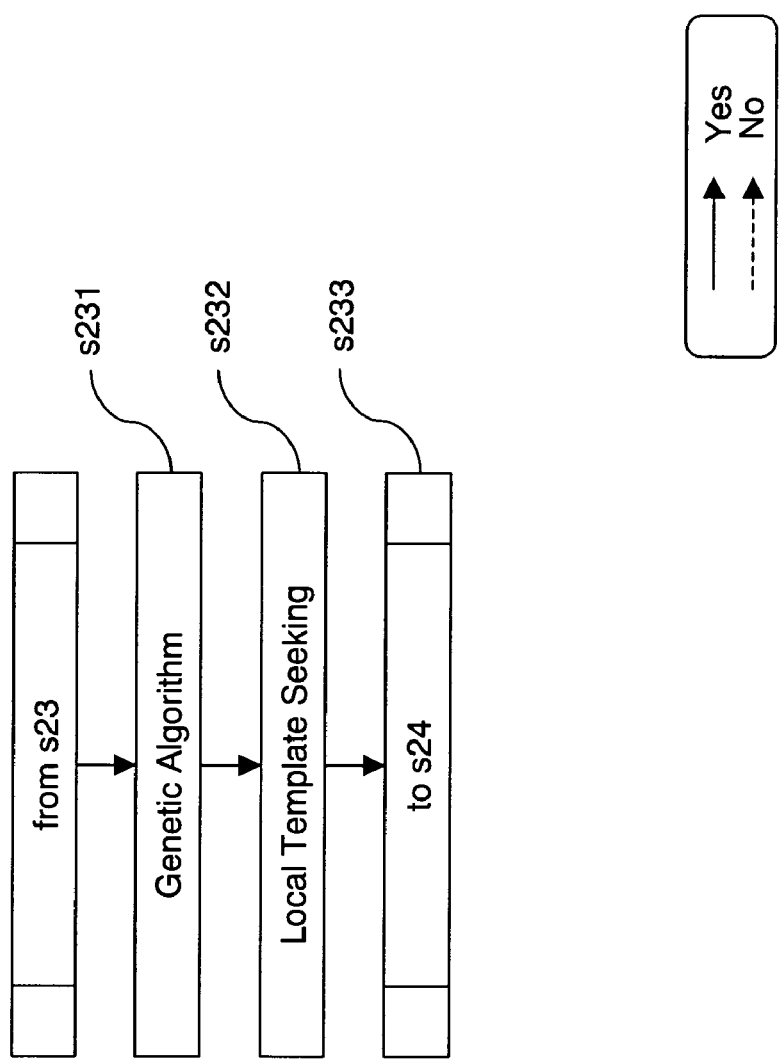
FIG. 31 is a flow chart to show the operation procedure of template seeking.

Next, template seeking of the step s23 in FIG. 28 is explained. As the flowchart in FIG. 31 shows, template seeking of the step s23 consists of two staged processes. At the first stage, a genetic algorithm s231 is executed using the template obtained by the image analysis of the step s21 as the initial template, in order to optimize the template. Then, at the second stage, the obtained template is further adjusted by local template seeking of the step s232 in the figure, to finish the step s23.

First, the genetic algorithm, s231 in FIG. 31, is explained. There are some published reference documents for genetic algorithms. An example may be "Genetic Algorithms in Search, Optimization and Machine Learning" by David E. Goldberg, ADDISON-WESLEY PUBLISHING, 1989.

A general genetic algorithm assumes that a virtual biological population consisting of individuals having genes exists in a predetermined environment, and that an individual who adapts itself to the given environment better can live longer and can have a higher possibility to have its own descendant. The genes of a parental individual are inherited to its child through the process called the genetic operation. Through evolution of genes and the biological population by repeating such generation alternation as mentioned above, the number of individuals having higher adaptability to the environment comes to seize the major part of the population.

Crossover and mutation that occur in actual biological reproduction are also used as genetic operation in the genetic algorithm.

Figure 12:
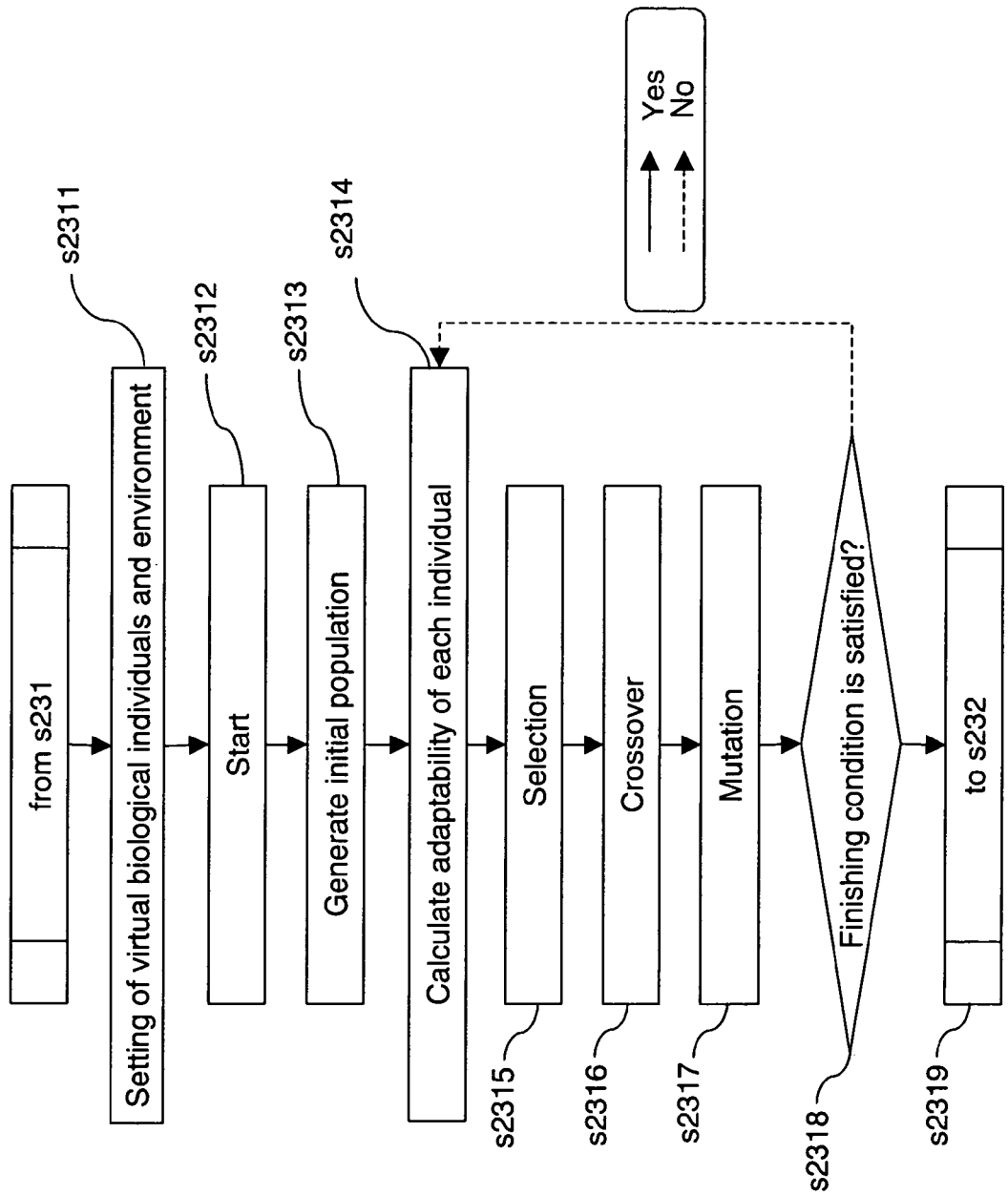
FIG. 12 is an operation flow chart of a genetic algorithm.
Figure 19:
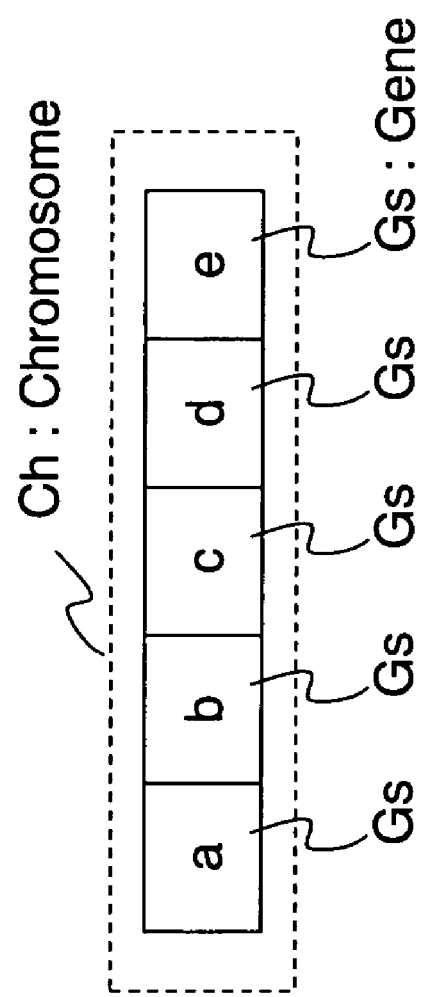
FIG. 19 is a modeling figure to show the relationship between a chromosome and genes.

FIG. 12 is a flowchart to show a rough procedure of a genetic algorithm explained above. First, the chromosome of each individual are determined at the step s2311. That is, the contents of data and the way of transferring the contents from the parental individual to the child individual are determined first. FIG. 19 shows an example of a chromosome. Let a vector "x" of variables in the present optimization subject be expressed by a column consisting of M-pieces of symbols, $A_i$ (i=1, 2, - - - , M), and consider the vector as a chromosome consisting of M pieces of genes. In the example of FIG. 19, "Ch" shows a chromosome and "Gs" shows a gene, and the number of genes, M, is 5 here. Values of genes, $A_i$s, are determined as a set of integers, real numbers within a given range or a line of simple symbols, according to the nature of the subject. In the example of FIG. 19, alphabets from "a" to "e" are the genes. An assembly of symbolized genes as shown in this example composes the chromosome of an individual.

Next, at the step s2311 in FIG. 12, a calculation method for adaptability that expresses how each individual adapts itself to the environment is determined. The method is determined so that as the estimation function value of the variable for the given subject becomes higher (lower), the adaptability of the corresponding individual becomes higher (lower). Also, at the process of alternation of generations that follows the adaptability calculation method decision, the process is determined so that an individual having higher adaptability can have a higher probability to survive or to make a descendant. Inversely, this process is designed so that an individual having lower adaptability should extinct, deeming that the individual is not adapting itself to the environment properly. This method reflects the principle of natural selection in evolutionism. Adaptability is a measure of superiority of an individual in terms of possibility of survival.

Generally speaking, the subject to be encountered is a complete black box at the beginning of seeking, so that what an individual is desirable is totally unknown. It is therefore usual to generate an initial biological population by using random numbers. In the genetic algorithm process of this invention, the initial biological population is generated by using random numbers at the step s2313 in FIG. 12, after starting the process at the step s2312. If some knowledge on the seeking space is already acquired, the population may be generated around individuals that are supposed to have high estimation values. Here, the total number of individuals generated is called the individual number of the population.

Next, adaptability of each individual in the biological population is calculated at the step 2314 based on the method decided at the step 2311. Then, at the step 2315, individuals that are to become the base of the next generation are picked up by selection. But selection merely raises the percentage of individuals having the presently highest adaptability among the existing population, without generating any newly sought points. Thus, crossover and mutation that are operations explained in the following are carried out.

At the step 2316, two individuals as a pair are randomly picked up at a predetermined occurrence frequency from the new generation individuals that are generated through selection, and a child chromosome is generated by reforming chromosomes of the picked up pair (crossover). Here the probability that crossover occurs is called the crossover rate.

The individual generated by crossover inherits the features of the two parental individuals. By the process of crossover, variety in chromosomes of an individual is deepened, and thus evolution occurs.

After the crossover process, a gene of an individual is changed at a predetermined probability at the step s2317 (mutation). Here, the probability of mutation occurrence is called the mutation rate. It sometimes happens in actual biological environment that the contents of a gene of an individual are rewritten at a low probability. It should be noted that if the mutation rate is set too high, features of the individual that are inherited from its parents would be lost and the result would be nearly the same as the result of seeking randomly in the seeking space.

Through steps explained above, determination of the next generation population is done. Then, at the step 2318, whether the newly generated population satisfies the specified evaluation criterion for finishing seeking or not is examined. The criterion depends on the subject, but some typical examples may be;

the maximum adaptability of individuals in the biological population exceeds a predetermined threshold, the ensemble average of population adaptability exceeds a predetermined threshold, for a predetermined number of successive generations, the adaptability increasing rate of the biological population lower than a predetermined threshold continues, or the number of alternation of generations exceeds a predetermined threshold.

The seeking is finished when one of above criteria is satisfied, and the individual that has the highest adaptability among the biological population at that time becomes the solution of this optimization subject. If the finishing condition is not satisfied, seeking is continued as the process is returned to the step s2314 of adaptability calculation for each individual. By thus repeating alternation of generations, adaptability of each individual can be raised, while maintaining the individual number of the population to a constant value. This is the explanation for the general genetic algorithm.

Since the scheme of the genetic algorithm explained above is not so rigid in that it does not specify actual programming in detail, it cannot provide a detailed algorithm for each of specific optimization subjects. For this reason, it is necessary to realize items listed in the following, in order to apply the general genetic algorithm to the template optimization in the invention.

(a) A method of expressing a gene, (b) A method of generating an initial population of individuals, (c) An individual evaluation function, (d) A method of selection, (e) A method of crossover, (f) A method of mutation, and (g) A condition to finish seeking.

FIG. 20 shows a method of expressing a gene in the invention. The figure shows an example where the number of reference pixels that compose a template is n and the area that can be referred is the region consisting of 256×256 pixels. In spite of this example, there is no size limitation in the invention for the area that can be referred. The size can be arbitrarily predetermined.

A chromosome is divided into n pieces of portions each of which corresponds to one reference pixel. Each portion is further divided into two parts, each of which determines the x coordinate and the y coordinate, respectively. Since the size of the area that can be referred is 256 in both the x direction and the y direction in the example, each of the two parts can be expressed by 8 bit binary numbers.

The coordinates of a reference pixel can be expressed by using Gray coded numbers, instead of using simple binary numbers. Also, it is possible to express a chromosome by using integers that show the coordinate of a reference pixel, instead of using binary numbers of 1 or 0, or instead of using Gray codes. In FIG. 20(b), for example, both the x-coordinate and the y-coordinate take values of {0, - - -, 255}.

In the embodiment of this invention, the initial template is determined for each of divided image block by using an analytic method. This initial template is embedded in the population of individuals, in order to compose the population of initial individuals.

Figure 26:
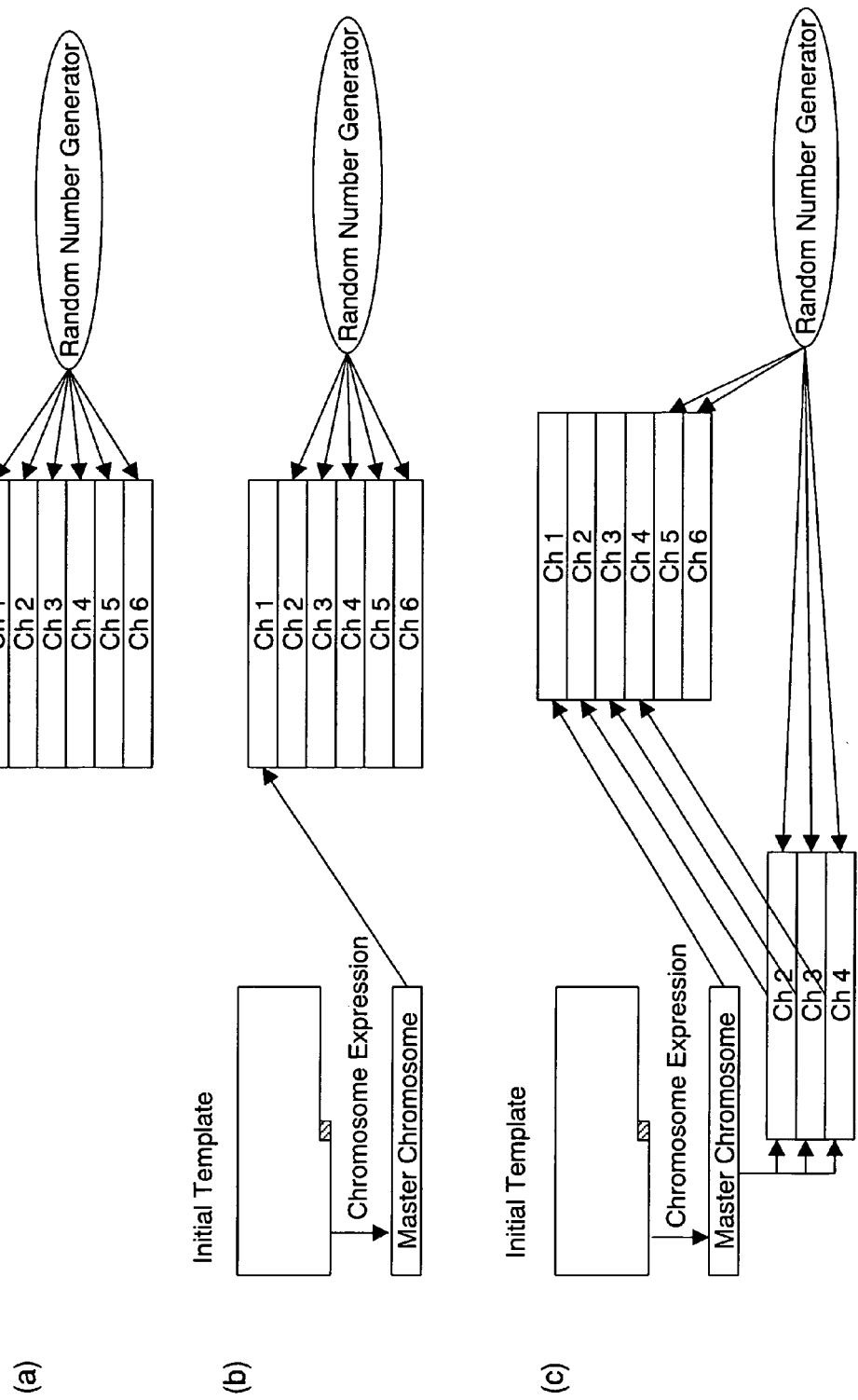
FIG. 26 is a modeling figure to show an initialization method example for a population of individuals in a genetic algorithm.

FIG. 26 shows schematic drawings to show examples of how to embed the initial template into the individual population that consists of six chromosomes. FIG. 26(a) shows a method to initialize all of chromosomes randomly, and is the same as an ordinary genetic algorithm. FIG. 26(b) shows a method where a master chromosome is generated as the chromosome expression of the initial template, this master chromosome is copied to the first chromosome in the individual population and the rest of five chromosomes are randomly initialized. The master chromosome can be copied not only to the first chromosome in the population but also to arbitral number of chromosomes in the individual population.

In the case of initialization by using the method of FIG. 26(b), seeking time becomes shorter as the number of copied chromosomes becomes larger. On the contrary in this case, however, possibility that evolution stops before the optimum template is found becomes high. By copying the chromosome that is generated by mutating the master chromosome to the individual population instead of copying many master chromosomes to the individual population, variety of the population can be maintained even in such a case as mentioned.

FIG. 26(c) shows a schematic drawing to show an example of this copying method. In this example, three chromosomes are mutated from a master chromosome, the first chromosome of the individual population is copied from the master chromosome, the second to the fourth chromosomes are copied from three chromosomes that are mutated from the master chromosome, respectively, and only the rest of two chromosomes are randomly initialized. The master chromosome can be copied to a plural number of chromosomes in the individual population and the number of chromosomes that are obtained by mutation of the master chromosome can be arbitrarily determined. These variations can be controlled by setting parameters.

As the evaluation function, F, of the genetic algorithm in the embodiment of the invention, the reciprocal of the size of the compressed data that is obtained by the compression coding of the input image data using the template that the individual determines is used. For example, if the image data is compressed to 1 K bytes, the value of adaptability becomes $1/(1 \times 1024)$.

Since the evaluation function F is maximized in the genetic algorithm, an individual expressing the template that minimizes the size of the compressed data is sought by maximizing the reciprocal of the compressed data size.

Not only the reciprocal of the compressed data size, but also anything that becomes larger as the compressed data size becomes smaller can be used as an index to measure the adaptability of the chromosome. For example, a value that can be obtained by subtracting the size of the compressed data from a predetermined specific value can be used as the measure of adaptability.

Since it requires a large calculation load to use the size of the compressed data for calculation of adaptability, it is possible to compress the image data every several pixels or every several lines for calculation of adaptability, instead of compressing the whole image for calculation of adaptability. Also, it is possible to compress a portion of the image that is cut out from the image for calculation of adaptability. By thus thinning out or cutting out, the time required for calculation can be drastically reduced, although accuracy of the evaluation function may be degraded.

Figure 3:
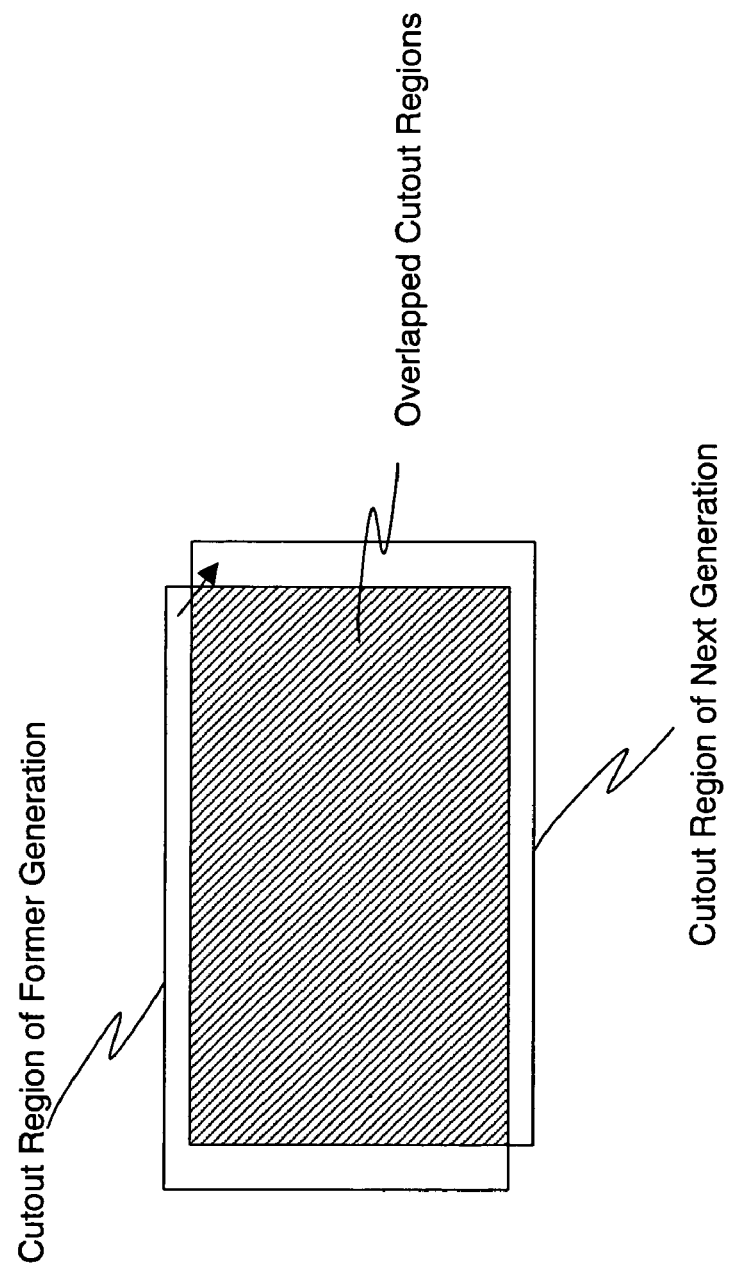
FIG. 3 is a modeling figure for shifting the extracting areas.

Meanwhile, the degradation in accuracy of the evaluation function can be reduced by shifting the area to be thinned out or cut out, for each generation. In case where the image is cut out by an m×m sized region, for example, the cutting out region is shifted by one bit in both vertical and horizontal directions for each generation. Most of the (m−1)×(m−1) region that is the major portion of the cut out region of the present generation overlaps the region that is cut out from the region of the parental generation (The hatched portion in FIG. 3). Therefore, the probability is high that the chromosome (the template) evaluated as superior in the parental generation is also evaluated as superior in the child generation. Moreover, the region wider by (2×m−1) bits is used for the evaluation as compared to the case without shifting the region. Thus, reduction of accuracy in the evaluation function caused by the cutting out of the region can be prevented, since wider regions can be used for the evaluation by repeating the process mentioned above.

While the shift value is one bit in the above-explained example, a wider area can be used for evaluation if a shift value is set to larger bits, which results in smaller degradation in the accuracy of the evaluation function. Instead, since the area that overlaps the parental generation's area becomes smaller, a lower seeking speed results. For this reason, the shift value should be altered according to the size of the cutting out area.

By using both cutting out and thinning out, the degradation in accuracy of the evaluation function can be further reduced. When the cutting area is too small as compared to the size of the objective divided image block, it takes much time to shift the cutting out area in order to include the whole block for scan. Whereas, the thinning out method is excellent in that it can maintain the statistic features in the large view, although relationship between adjacent pixels is missed. So that, when both of these two methods are used together, not only the weak points of them are be complemented each other, but also degradation of the evaluation function accuracy can be reduced much, by using a smaller size cutting out region and by expanding the thinning out interval.

The size of the cutting out region is set to 256 bits×256 bits and the shifting bit size is set to one bit in the embodiment example of this invention. Also, the thinning out spacing is set to (H/256) in the vertical direction and (W/256) in the horizontal direction, where H and W denote sizes of the cutting out region in the vertical and horizontal directions, respectively. Additionally, the offset (the position of the first scanning line) is shifted randomly by one bit both in the vertical and the horizontal directions, in order to reduce bias in sampling.

The entropy can be used as the evaluation function, in stead of the size of the compressed data. Since minimizing the entropy is equivalent to minimizing the size of the compressed data from the stand point of the information theory, they are not distinguished ideally. Cutting out or thinning out that are explained above may be used also in calculating the entropy.

At the selection step, selection of an individual at the probability that is proportional to its adaptability is repeated by times of the individual number of the population (roulette selection). A new individual population is formed by this step. Other selection methods such as tournament selection or ranking selection may be also used.

At the crossover step, the method shown in FIG. 21(a) is applied to two parental individuals A and B that are picked up randomly from the parental population. This method is called the one-point crossover that is characterized as a portion of one chromosome starting at a random coordinate position in the chromosome is interchanged as a block with the portion of the other chromosome starting at the same coordinate position. Ch1 and Ch2 are the parental chromosomes A and B, respectively, in case of FIG. 21(a). The two chromosomes are crossed over at a randomly chosen crossover point shown as CP in the figure, which is the point between the second gene and the third gene. By exchanging the partially cut off genes each other, new individuals, A' and A', that have chromosomes Ch3 and Ch4, respectively, are generated.

If a chromosome pair picked up randomly from the population at crossover has the same gene structure, one of the chromosomes of the pair is mutated in order to avoid slowing down of the template seeking speed. Mutation is explained in detail later.

Since a template is expressed by chromosomes as shown in the example of FIG. 20, it can be said that a chromosome contains a number of blocks having meaningful information with 16 bit length as shown in FIG. 20(b). So, by setting the probability of choosing the crossover point from other points than each gap between two adjacent blocks low, the probability that a meaningful information block is broken by crossover is expected to become low, resulting in speed up of template seeking.

On the contrary, however, template seeking tends to converge rapidly at the initial stage, since the probability of generating a new information block by crossover becomes small by the above-mentioned process. In order to avoid this unintended early convergence of seeking to happen, it is effective to set the probability of the crossover point to be selected at a point other than a gap between any two adjacent information blocks to a large value at the early stage of seeking, and to set this probability to a small value as alternation of generations progresses, in order that all of the possible crossover points should be selected at the same probability at last. This method can be applied not only to the one-point crossover, but also to other crossover schemes such as the two-point crossover, the multi-point crossover and the uniform crossover.

Figure 4:
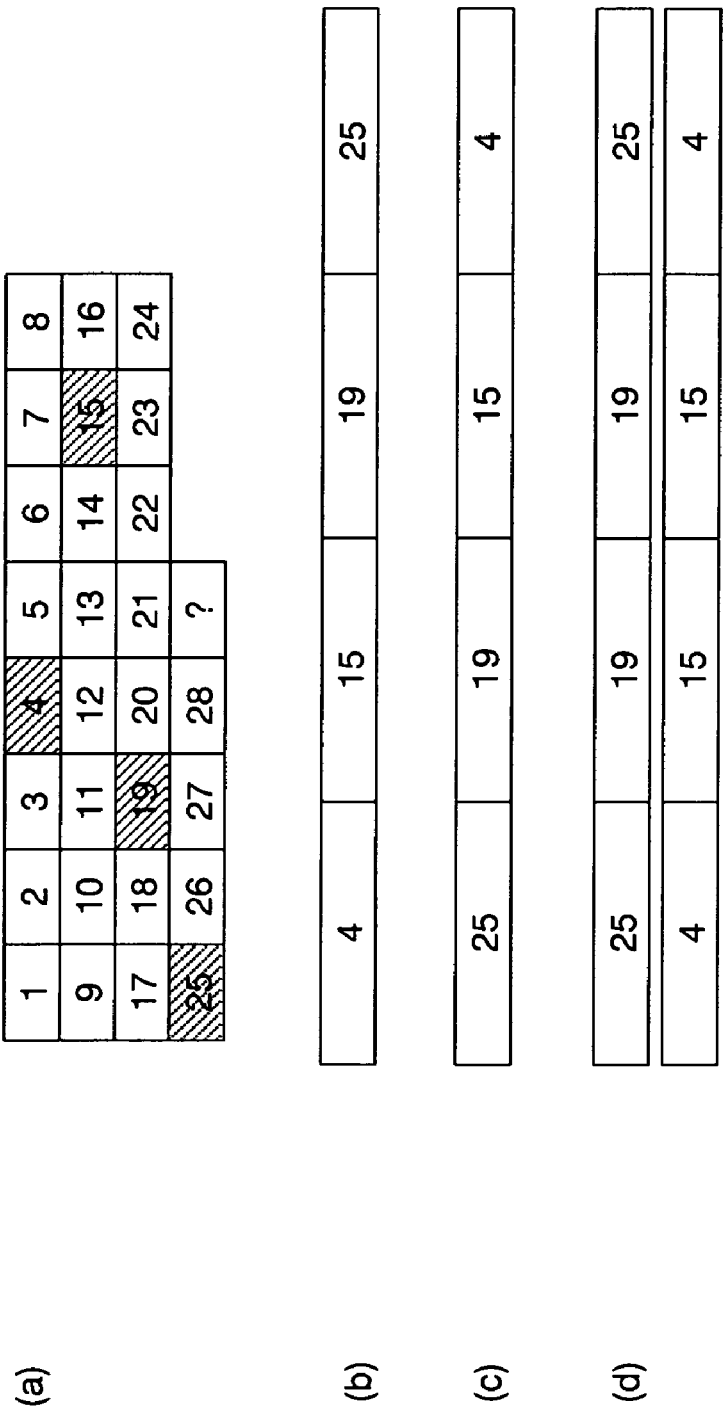
FIG. 4 shows examples where the same template is expressed by different chromosome combinations.

It is possible to further accelerate the seeking speed by considering the reference pixels that are commonly contained in both chromosomes selected as a pair at crossover. An example is shown by a template in FIG. 4(a). In the figure, the square marked by the symbol "?" shows the noticed pixel, and the hatched squares mean reference pixels. A template expressed by these reference pixels is shown in FIG. 4(b) in the chromosome expression, where each number shows each of information blocks, and crossover points (CP) are limited at a gap position between any two adjacent information blocks. The chromosome shown by FIG. 4(c) is another chromosome having the same template (a set of reference pixels) as the one in FIG. 4(b).

If these chromosomes are crossed over at the CP of the gap position between second and third information blocks, then two new chromosomes generated by crossover become totally different each other and totally different from their parents, which results in a slower seeking speed.

Figure 5:
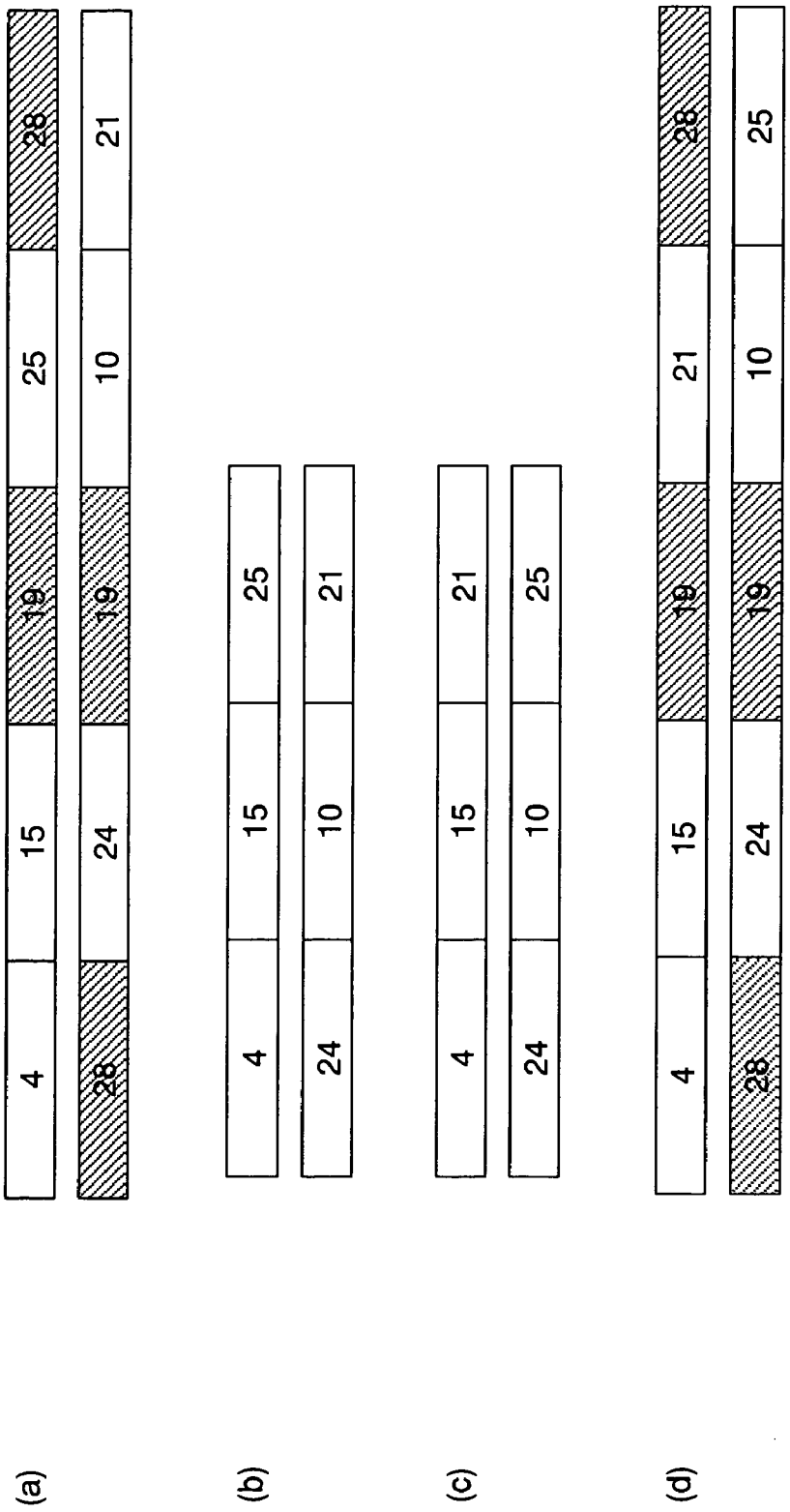
FIG. 5 is a figure to explain the crossover based on template expression.

In order to solve this issue, information blocks corresponding to the reference pixels not commonly contained in either of templates are picked up from each of two chromosomes expressed by the templates, and crossover is carried out only between these picked up partial chromosomes. This process is explained in detail by using FIG. 5. A case is assumed where the crossover between two chromosomes as shown in FIG. 5(a) is carried out. The two chromosomes shown in the figure commonly include reference pixels 19 and 28. The pixel numbers that show their positions are shown in FIG. 4(a). FIG. 5(b) shows two partial chromosomes each of which consists of information blocks that correspond to other reference pixels than the pixels that are commonly referred by the noticed pixel. These picked up partial chromosomes are crossed over then. FIG. 5(c) shows the result of the one-point crossover using the CP at the gap position between the second and the third information blocks. The two partial chromosomes thus picked up and crossed over are finally returned to the respective original chromosomes, as the result shown in FIG. 5(d).

If the length of the two picked up partial chromosome is null at crossover based on the template expression as is explained above, it means that the original two chromosomes express the same template. In such a case, only one of the two chromosomes will be mutated, in order to avoid slowing down in seeking speed caused by same templates included in one population, as explained previously. The mutation is explained in the following.

Mutation used here after crossover is a process that reverses values of all genes in all chromosomes at a predetermined mutation rate. FIG. 21(b) shows an example of mutation. In this example, the value of the second gene in the chromosome Ch5 is reversed as the result of mutation at a given mutation rate.

If integer numbers are used in expressing chromosomes instead of using binary one/zero expression, reversing simply binary numbers cannot be used. In such a case, adding a normal random value that is generated according to the Gaussian distribution N (0, σ) to each gene of the chromosome is carried out. Other distributions such as the Caucy distribution may be used for the purpose.

Mutation can be carried out not bit-wise but information block-wise. In the example shown in FIG. 20(b), the value of each information block takes a positive integer number between 0 and 65535, since each information block consists of 16 bits. In mutation, a value of $\pm(1+\alpha)$ is added to or subtracted from each information block value at a predetermined mutation rate. As the value of $\alpha$ becomes smaller, the effect of mutation becomes weaker and the template seeking speed by the GA (genetic algorithm) is improved. A too small $\alpha$ value, however, results in convergence at an early stage of template seeking, which means failing in obtaining a good template. Inversely, while a large a value can avoid undesired early convergence in template seeking, it reduces seeking speed. By setting the $\alpha$ value large at the initial stage of template seeking and by reducing it smaller by smaller as alternation of generations proceeds, seeking speed at the later seeking stage can be expedited, avoiding unwanted convergence at the early seeking stage.

Mutation process explained above can be applied to each of the x-coordinate and the y-coordinate that compose each information block, separately. By doing this, further detailed adjustment of mutation becomes possible.

It is also possible to use the steady state genetic algorithm. This method is to pick up the most superior individual and to pick up another individual randomly from a population, to generate two child individuals by crossover and then mutate one of the child individuals, and to replace the most inferior individual in the initial population with the mutated child individual. This method has a feature that it hardly falls into a local optimum solution, since only one individual in each generation is replaced. Seeking speed can be further accelerated, by allowing the replacement only when adaptability of the individual generated by crossover and mutation exceeds adaptability of the most inferior individual in the parental population.

For the template optimization, a so-called blind-seeking method such as the evolution strategy, the hill-climbing method, the annealing method, the taboo seeking or the greedy algorithm can be used instead of using the genetic algorithm. The hill climbing method and the annealing method can provide fast processing speed although seeking capability is not such excellent as the genetic algorithm provides. Either of the compressed data size and the entropy can be used as an evaluation function for any of above-mentioned blind seeking methods.

Detailed explanation of the evolution strategy can be seen, for example, in H. P. Schwefel: "Evolution and Optimum Seeking", John Wiley & Sons, 1995. Also, detailed explanation of the annealing method can be seen, for example, in E. Arts and J. Korst: "Simulated Annealing and Boltzmann Machines", John Wiley & Sons, 1995.

Next, the local seeking step s232 in FIG. 31 is explained.

Figure 22:
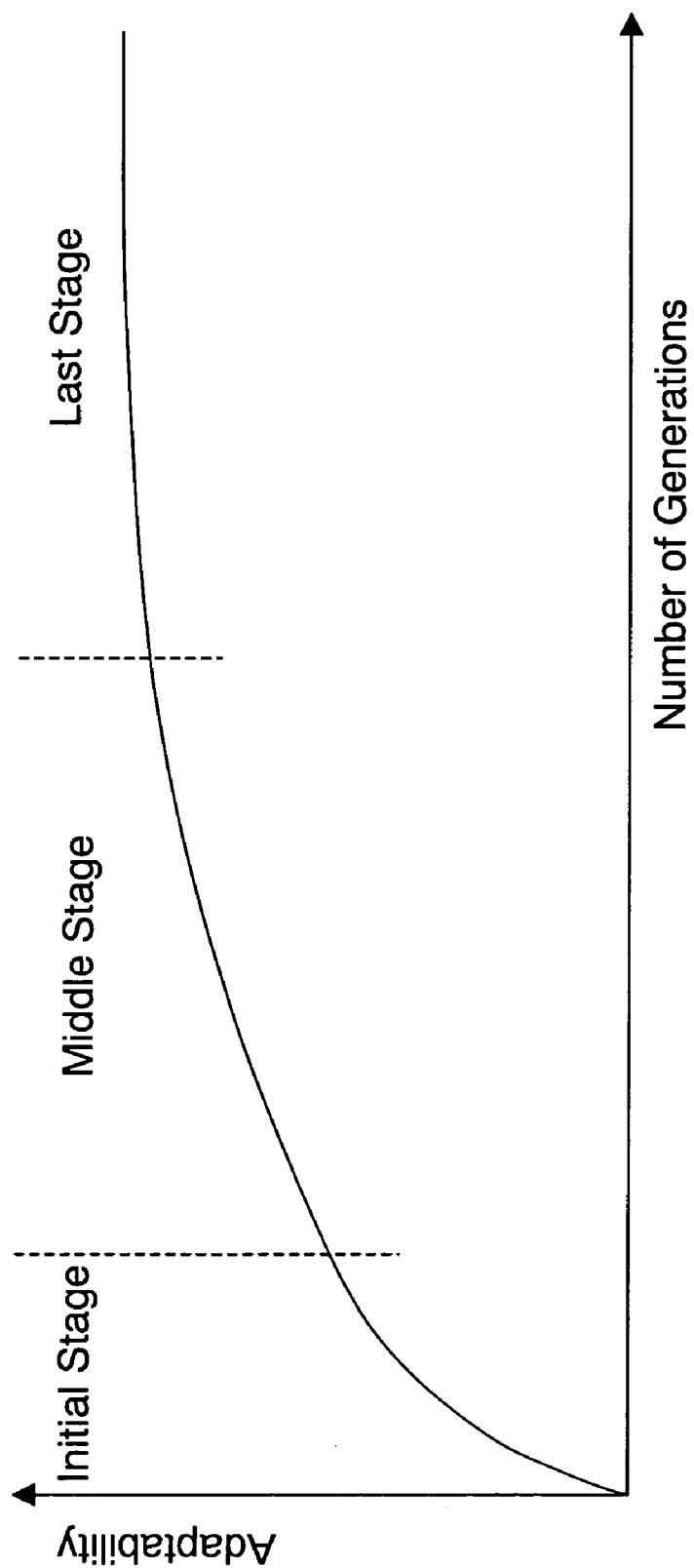
FIG. 22 shows a generic example of a learning curve in a genetic algorithm.

Although the genetic algorithm is a very powerful seeking method, it has a problem that seeking speed becomes slower at the last stage of seeking reaching near to the optimum solution or to a local solution. As an example shown in FIG. 22, the adaptability increasing rate becomes smaller as alternation of generations proceeds from the initial stage to the middle stage, and almost no improvement is made in the last stage. In the embodiment of this invention, the final adjustment is made on the best template that is obtained by the genetic algorithm, by using the hill-climbing method. By introducing this adjustment, the total seeking speed can be expedited, since the time consuming last stage of seeking in the genetic algorithm can be skipped.

In a perfectly monochrome image block, it is not necessary to carry out template optimization, since the compression rate becomes the same value whatever template is used. So in the embodiment of this invention, a check whether each image block is monochrome or not is carried out at the image division step s1 in FIG. 8, and if it becomes clear that the block is monochrome, then the template optimization for that block is skipped. Although block division, optimum template seeking and optimum template decision are carried out by the processor shown in FIG. 34, it is possible to configure the system in a way that a dedicated calculation unit is implemented in the compression/decompression portion in the figure and processes up to the optimum template decision mentioned above are carried out by this dedicated calculation unit.

Explanation for the template seeking step s23 in FIG. 28 is completed here, and explanation for the database renewal step s24 in the figure will be made in the following.

The database is used when experimental knowledge on the image data to be compression coded is already known and the template is decided without carrying out the image analysis step s22 nor the template seeking step s23. Especially in an image for printing, the image generating procedure based on a dithering method is specifically determined by the manufacturer of the software program, having the manufacturer-specific characteristic in generating a dither matrix, for example. Although such a manufacturer-specific characteristic is not opened by the manufacturer for utilization by others in general, by accumulating the results of template seeking into the database as is done in the embodiment of this invention, the accumulated knowledge can be re-used as important clues in deciding the optimum template for a new image. Also, if the template seeking step s23 in FIG. 28 is carried out by using the information that is registered in the database as an initial value, it is possible sometimes to find a better template.

Figure 13:
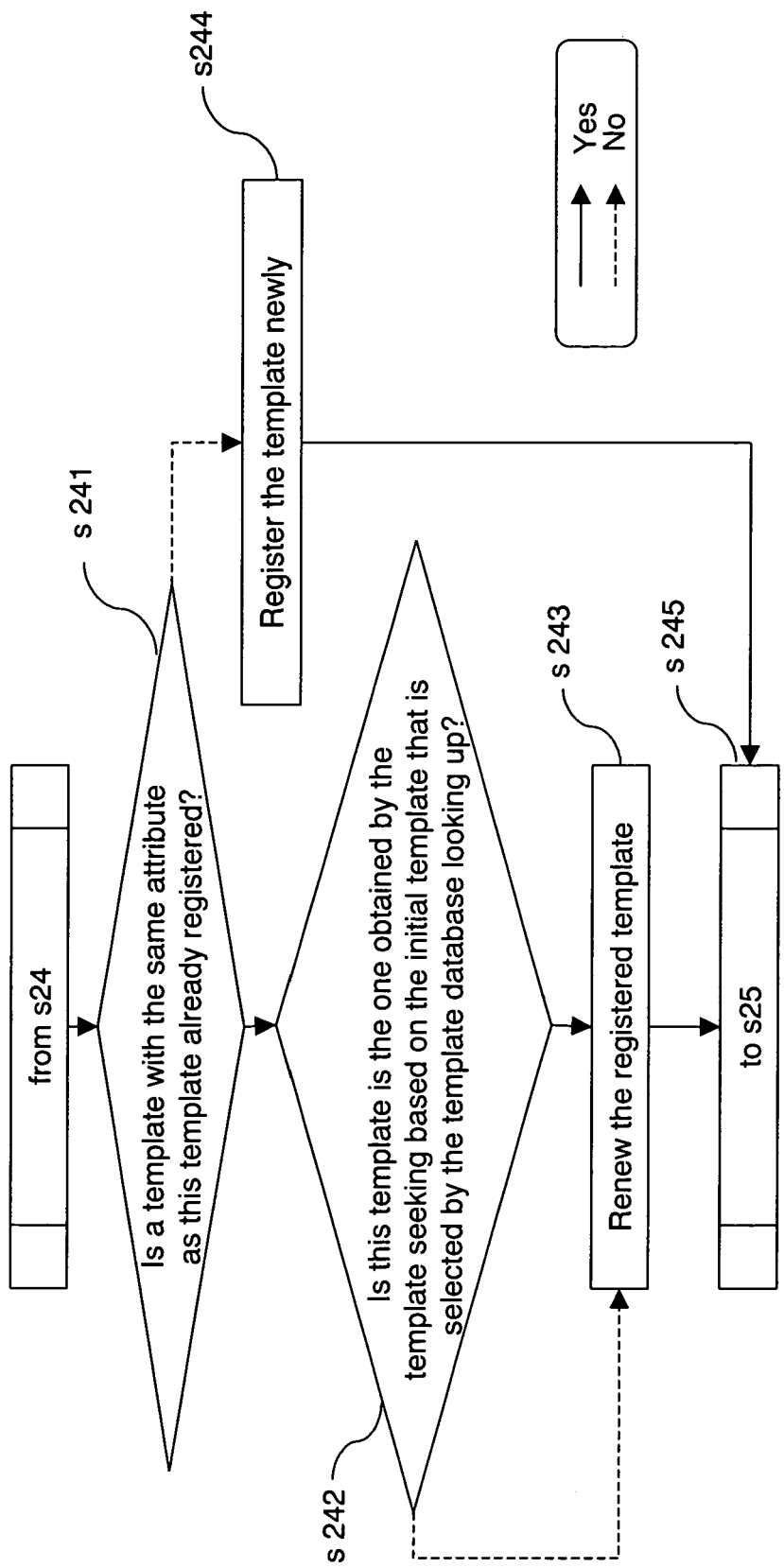
FIG. 13 is an operation flow chart of the renewal of the template database in the embodiment example of this invention.
Figure 14:
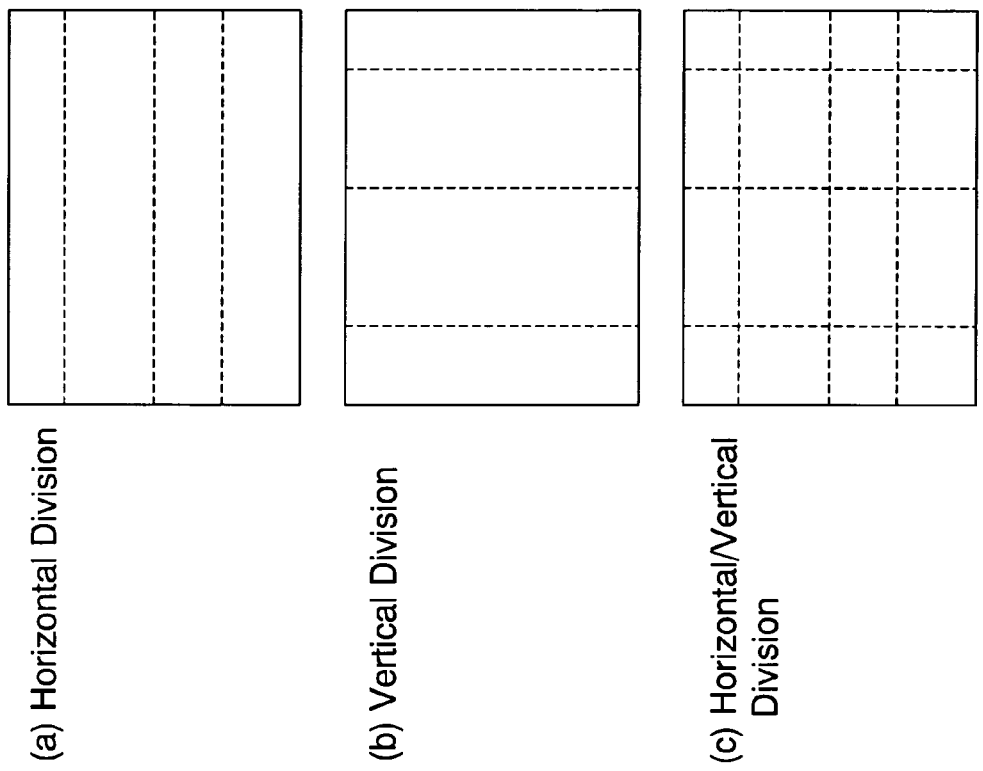
FIG. 14 is a modeling figure to show how to divide an image into blocks.

FIG. 13 is a flow chart to show an operation of the template database renewal step 24 in FIG. 28.

First, at the step s241 in FIG. 13, the template database that has the structure shown in FIG. 16 is looked up to find out whether a template that is generated by the same image generating system and that has the same resolution, scanning line number and the screen angle as those of the noticed template is already registered or not.

If no such templates are registered, the present template that has been obtained newly by the template seeking is registered in the template database as a new data, and then the step s24 is finished. By thus registering a new template, it can be re-used at the database looking up step s21 in the template optimization step s2.

If it is found that the matching template is already registered in the database, then whether this template is the one that is optimized by the template optimization step by using the initial template obtained by the template database looking up or not is examined. If it is, then this template replaces the already registered template at the step s243, since it can be expected that this template is superior to the already registered one in terms of quality. Here, superior in quality means that a higher compression rate can be attained by using this template for the predictive coding.

The optimum template for each divided block can be obtained by processes explained heretofore. Actual compression process for each block is started then. The necessary portion of the image data that is divided into a block is cut out and sent to the reference buffer shown in FIG. 35. Here, the size of the necessary portion means the height as the line number from the noticed pixel position to the furthest pixel position in the vertical direction and the width as the distance from the noticed pixel position to the furthest pixel position in the horizontal direction.

Next, the context, that is the vector data consisting of reference pixel values, is extracted from the reference buffer based on the template.

Figure 35:
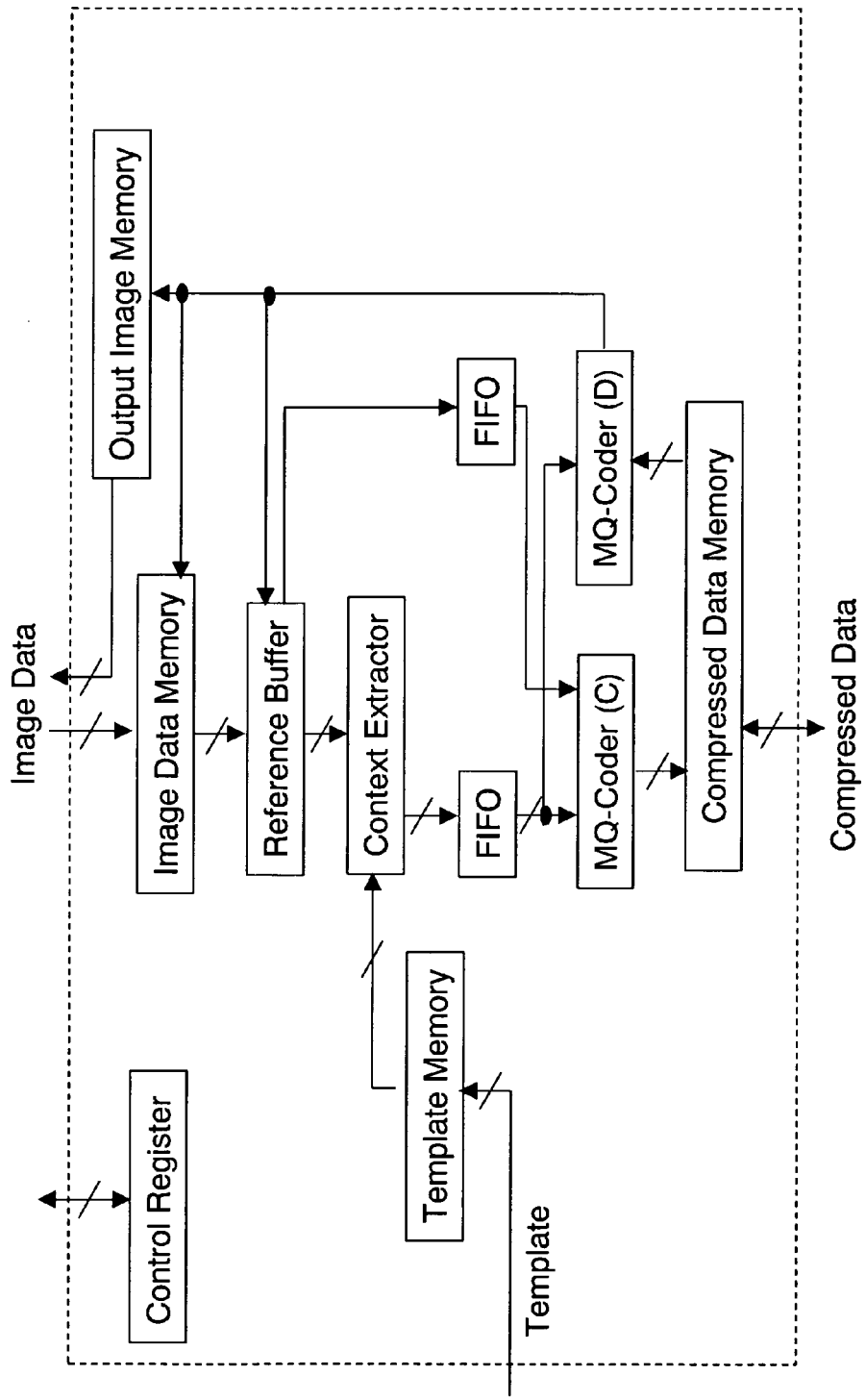
FIG. 35 is a block diagram of the compression/decompression processor.

The extracted context and the noticed pixel value are sent to the MQ-Coder (C) via the following FIFO and the compressed data is calculated. The MQ-Coder (D) in FIG. 35 is the MQ-coder for decompression. In the hardware configuration example of FIG. 35, the MQ-coder (C) for compression and the MQ-coder (D) for decompression are implemented as separate devices in order to realize high-speed processing easily. Only one MQ-coder that can execute both compression and decompression may be used in order to minimize the gate numbers in the LSI, since it is theoretically possible for the MQ-coder to carry out reversible operation. The structure and processing procedures of the MQ-coder are clearly defined by the international standardization body on the JPIG2 algorithm. Also, other entropy coding apparatuses such as the QM-coder or the Johnson coder than the MQ-coder can be used.

After the process in the MQ-coder (C) is finished, the region that is shifted by one bit is cut out next and sent to the reference buffer, the context is extracted and the calculation of compression at the MQ-coder (C) is carried out. The same procedure is repeated until the end of the image is reached.

Once the end of the image is reached, then the image region that is shifted by one bit to the right direction from the left edge of the image is cut out to be sent to the reference buffer, and the above-mentioned procedure is repeated until the lower edge of the image block is reached.

It is possible to expedite the processes explained above such as cutting out regions to send to the reference buffer, extracting contexts and compression coding calculation in the MQ-coder, by carrying out these processes through pipe-line processing.

Figure 36:
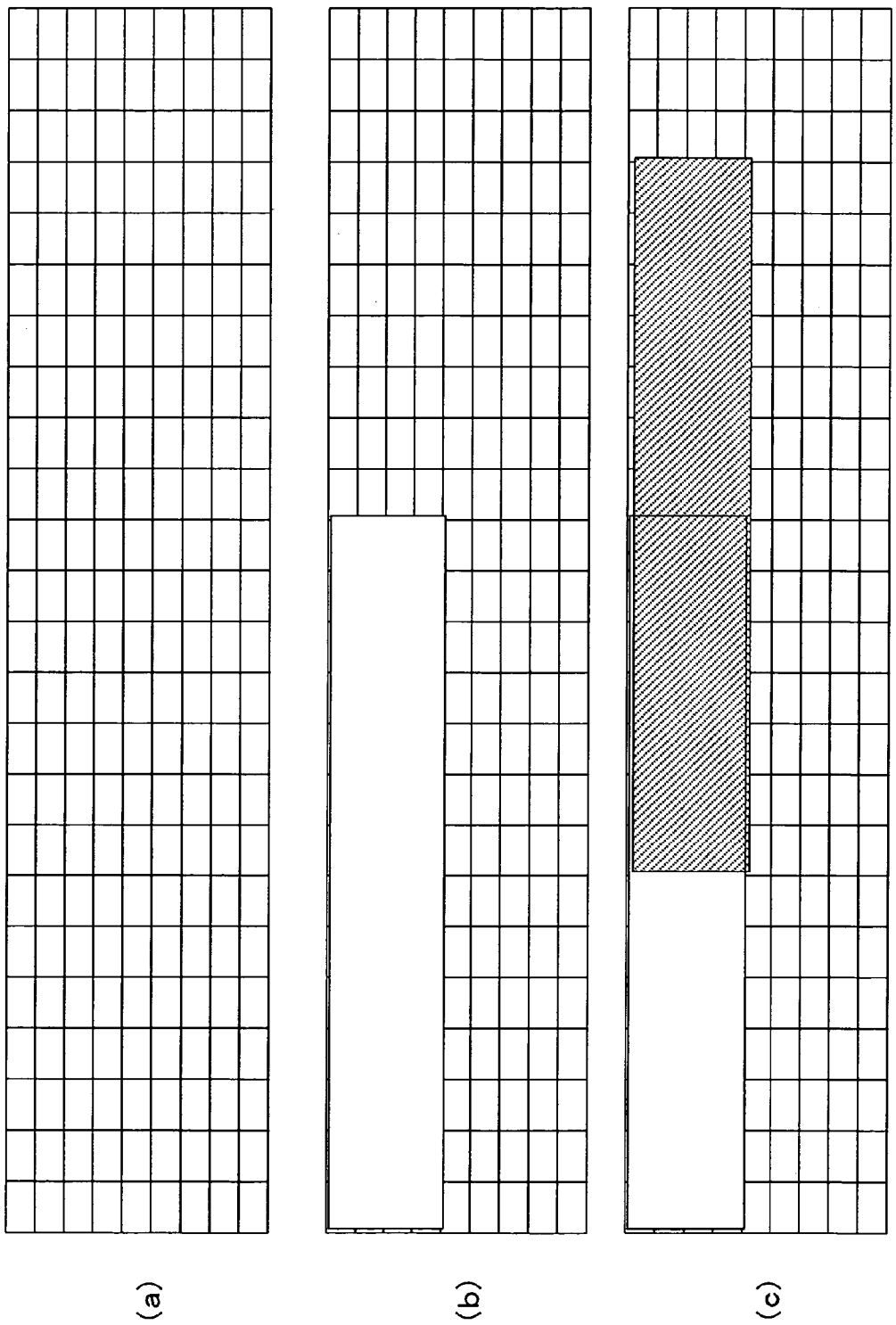
FIG. 36 is a modeling figure to show the operation procedure of the parallel working reference buffer.

Acceleration in processing speed by using pipe-line processing can be realized as preparing two reference buffers and operating them in parallel alternately. The operation is explained by using FIG. 36. It is assumed that the size of the image block is as shown in FIG. 36(a). If the region of reference pixels that is accessible by the noticed pixel is set as 8 pixels×4 lines in this example, the size required for the following process by the context extractor becomes 8 pixels×4 lines at the minimum. So that the required size of the reference buffer is 4 lines in height and any pixels more than 8 in width. Here, in the figure, the width is set to 16 pixels.

First, the upper left corner of the image block (the blank rectangular in FIG. 36(b)) is written into the first reference buffer. Since the width of this reference buffer is 16 pixels that is twice as large as the size required for extracting the context, the number of contexts that can be extracted is eight by repeating extraction calculation with one bit shifting eight times. During eight times of context extraction calculation, the area that is shifted by eight bits (the hatched rectangular in FIG. 36(c)) is written into the second reference buffer. Just after the first reference buffer finishes providing data of areas necessary for eight times of context extraction calculation, the second reference buffer starts provision of the area data with 8 bit shift without interruption. By alternating above-mentioned processes in turn, the time required for writing the area data into the reference buffers can be almost fully hidden.

In determining the width of the reference buffers how many times of the necessary width for one time context extraction, appropriate setting is required depending on the time required for one time writing into the reference buffer and on the time required for context extraction.

Explanation of operation procedures for the image data compression hardware embodiment shown in FIG. 34 is completed. Decompression of image data for restoring the original image can be carried out by reversing procedures that are explained heretofore.

The Second Preferred Embodiment Example

Figure 32:
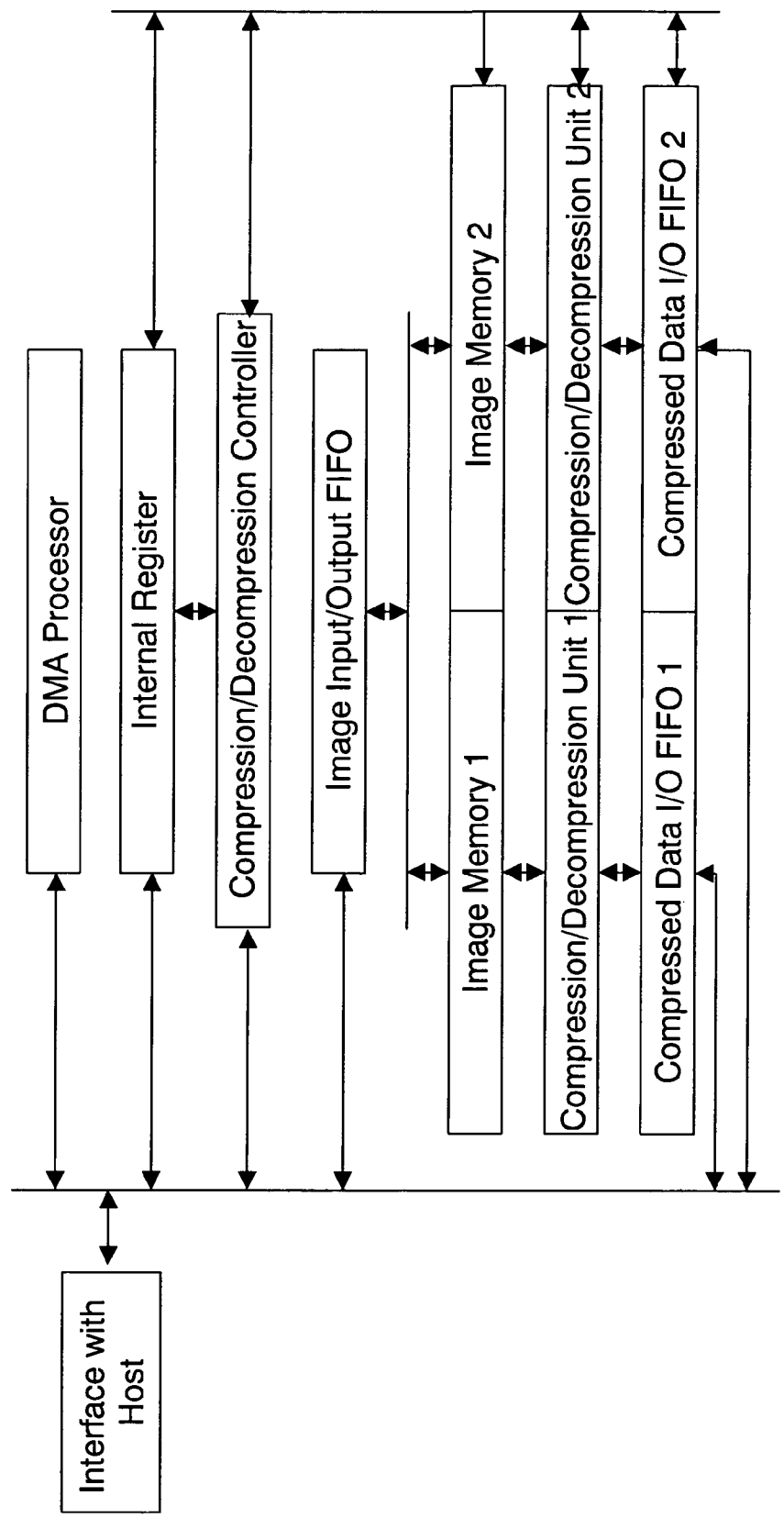
FIG. 32 is a block diagram of the parallel working hardware for image data compression.

FIG. 32 shows a block diagram of the hardware for image data compression that introduced parallel processing as much as possible in order to accelerate operation speed for compression and decompression. The configuration of compression/decompression units in the figure are equivalent to the whole configuration of FIG. 35 except that the former does not include either of the image data memory and the control register. In the configuration of FIG. 32, a DMA processor is used for carrying out fast transmission of image data and compressed data to and from an external host computer by using the DMA (Direct Memory Access) transmission scheme.

The features of parallel processing are in that it divides forcefully the image data stored in the image memory into several regions in the vertical direction, and in that it compresses each of them independently in parallel. Since the example of FIG. 32 employs double parallel processing, the time required for compression and decompression is reduced to a half. If n sets of image memories, compression/decompression units and compressed data I/O FIFO are used, then the processing speed can be increased by n times, since the n-multiple processing becomes possible.

In FIG. 32, the two image memories are looked as if they are only one continuous memory by the image input FIFO. The image data is therefore written into these two memories line by line successively.

Image block division and template optimization for image compression can be carried out for each vertically divided image region independently. Or otherwise, it can be configured as image block division and template optimization for image compression are carried out by the same processes as are used in the first embodiment of the invention, regarding the vertically divided image region as one big block, and only data compression is carried out for each image region in parallel and independently. A higher compression rate can be expected for the former method, while faster processing is realized by the latter method.

In decompression using the hardware configuration of FIG. 32, it is necessary to confirm that processing for the same line is completely finished in both of the image memory 1 and the image memory 2, before starting outputting the processed data for that line to the image Input/Output FIFO.

The Third Preferred Embodiment Example

The predictive adaptive coding and decoding methods explained by the first and second embodiment examples of the invention can be realized easily by a computer, by recording programs that execute such predictive adaptive coding and decoding methods explained heretofore into a hard disk, a flexible disk, a CD-ROM, a DVD-ROM or one of all other recording devices, and by reading the programs from the recorded device into the computer.

Figure 23:
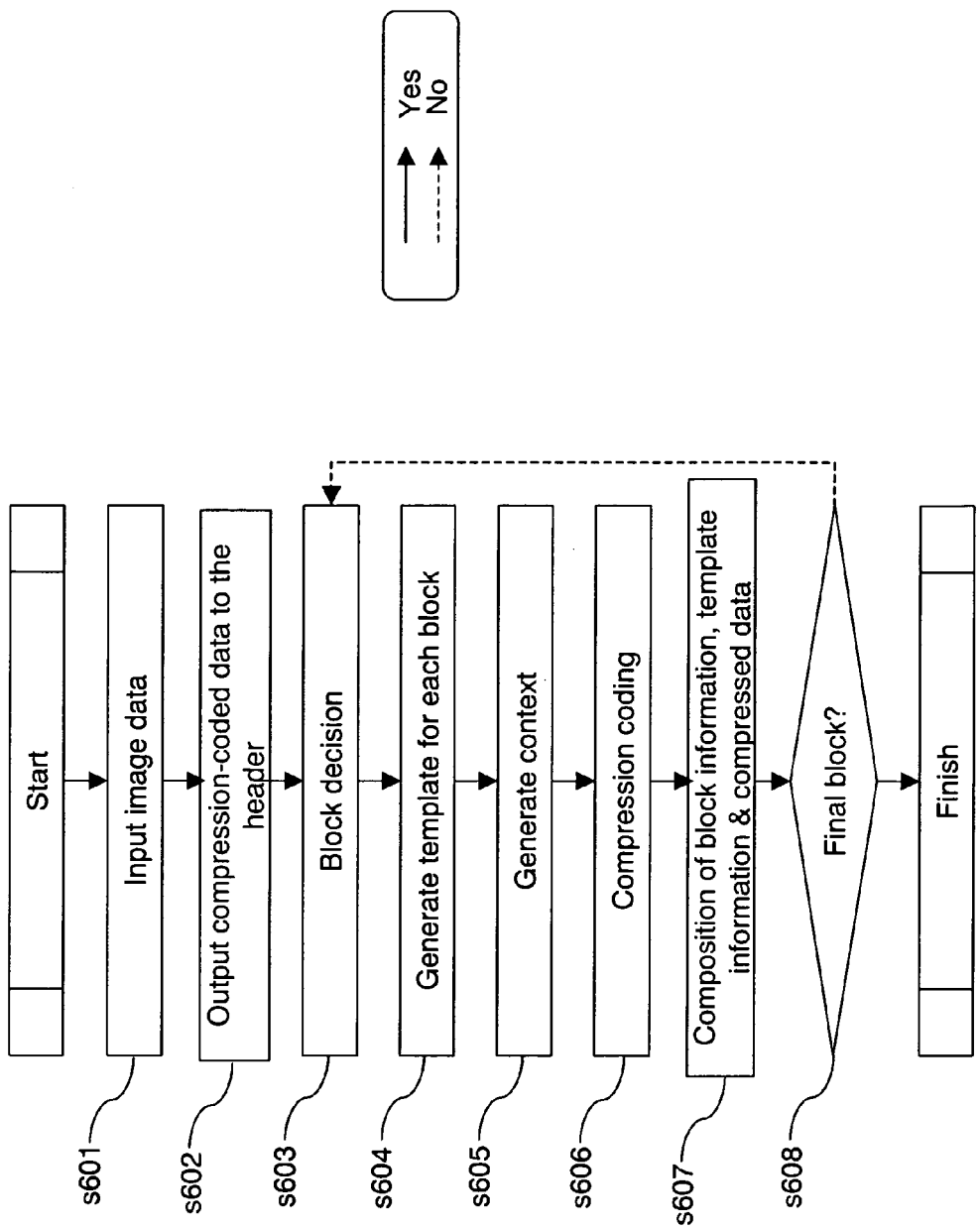
FIG. 23 is a flow chart to show the operation procedure of the coding program.

The predictive adaptive coding program executes the following processes as the flowchart in FIG. 23 shows;
(1) the process of inputting the image data to be compressed (s601),
(2) the process of generating and outputting a header for the compression coded data (s602),
(3) the process of dividing the inputted image data into blocks each of which has its specific feature (s603),
(4) the process of generating the optimum template for each divided image block (s604),
(5) the process of generating a context for each one of all pixels in the image block in order of scanning directions (s605),
(6) the process of generating the compressed data by using each one of all pixels in the image block and each context for each pixel generated by the step s605 (s606) and
(7) the process of generating and outputting the compression-coded data by composing the block information, the template information and the compressed data that are obtained by processes hereinbefore (s607).

In realizing above-listed processes by software, the execution method where data for the whole image is inputted once, block division is executed then and compression coding is carried out for each divided block may be used (two-path method), instead of using the execution method where data input and block division are carried out simultaneously as shown in the first embodiment of the invention (one-path method), since it is generally easy to have enough memory capacity than to have enough hardware processing speed.

FIG. 24(a) is a modeling figure to show a data formatting example of the compression-coded data in a case where the image data to be compressed is divided into n pieces of blocks. One unit of the compression-coded data is consisting of the header portion and n portions of compression information for each image block. In the header portion, the sizes of the image data to be compressed (the vertical size and the horizontal size), image resolution, the line number, the screen angle, the name of the image generating system, its version number and others.

FIG. 24(b) shows a structure example of the compression information unit for the i-th image block, which is consisting of the block header that records the block size and the block position (block information), the template used for compression coding of the corresponding image data, compressed data and the ending mark to show the tail of the i-th compression information unit.

The decoding program executes the following processes as the flowchart in FIG. 23 shows;

(1) the process of inputting the compression-coded data (s701), (2) the process of analyzing the compression-coded data, separating the total size of the decompressed image data (vertical and horizontal sizes) and the compression information on each of divided blocks from the compression-coded data, extracting each template that is used for compression of each block and extracting compressed data (s702), (3) the process of generating each context successively from the starting position of the decompressed image data (s703), (4) the process of generating the decompressed data from the compressed data by using each context (s704), and (5) the process of composing expanded data for each block and generating the decompressed image data (s705).

This invention can be applied to any ordinary two-level images including character images, line images, two-level images coded by the dithering method, the error diffusion method or any of other methods, and any other two-level images including any combinations of them. Furthermore, the invention can be applied to multi-level images also, by converting a multi-level image to a number of two-level images, by using the bit slicing technology or the image width expanding technology. Bit slicing is explained by using FIG. 27(a) as an example, where each pixel of an image is expressed by 8 bits as the small boxes in the figure show. Bit slicing is the method to break down one image consisting of these 8 bit pixels (the large box in the figure) to eight images consisting of one bit pixels that are broken out from only the first bits to only the eighth bits of original 8 bit pixels (eight planes in the figure).

By bit slicing, an image containing high frequency components is converted to images containing lower frequency components. Since compression of an image containing high frequency component is generally difficult, each of multi-level pixel values can be converted to alternating binary coded numbers (Gray codes) before bit slicing, in order to avoid this difficulty. If the original image consists of a limited number of colors, further efficient bit slicing can be realized by converting the order of the bit row according to correlation between colors.

Figure 27:
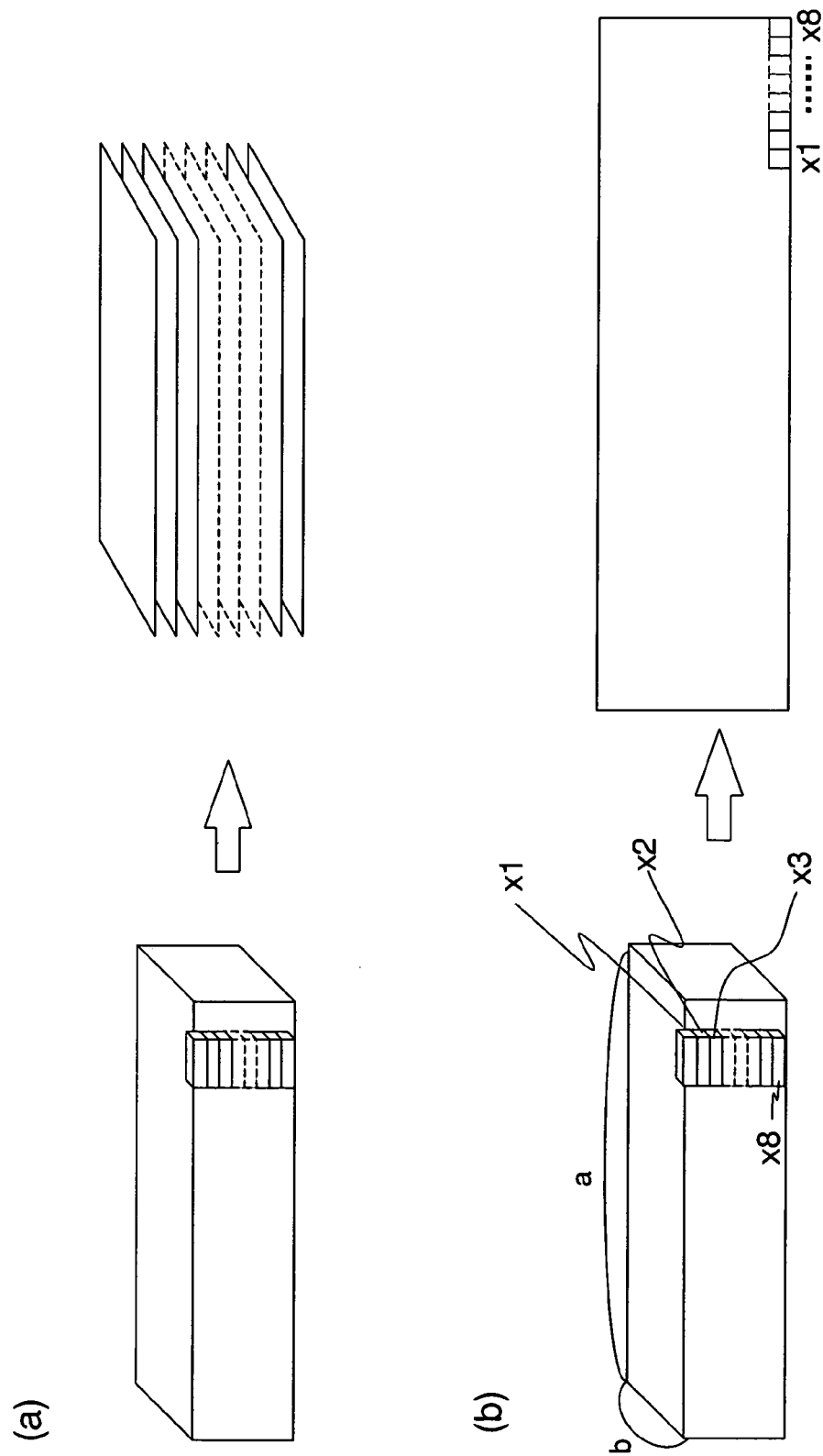
FIG. 27 is a modeling figure to show an example of how this invention can be applied to coding of a multi-level image.

Image width expanding is explained by using FIG. 27(b) as an example, where each pixel of an image is expressed by 256 levels (8 bits) as the same as shown in FIG. 27(a). Image width expanding is the method to expand the width of the two-level image virtually up to eight times as large, and break down each pixel that composes the eight-level image into a segment of bits placed on the line of the virtually expanded two-level image, as shown in FIG. 27(b).

The embodiment of the invention has been explained heretofore by using figures, but the invention is not limited to embodiment examples explained in the description, but includes all of other configurations or methods that can be easily altered or derived from the claims of the invention. For example, the data coding method of this invention can be applied to any arbitral data whereof any correlation exists between bits such as a text file and a data file in any software application systems, although the image data is used as the input data in the embodiment examples of the invention explained heretofore.

FEASIBILITY OF INDUSTRIAL APPLICATIONS

By this invention, the same template can be used unconditionally within an image information block by dividing the inputted image information into respectively homogeneous blocks. Also, flexible optimization of the template becomes possible by appropriate image division into blocks, making it possible to raise accuracy in estimating pixel values for each divided image block, which results in compression efficiency improvement as a whole.

Differently from conventional methods, in the invention, a template with higher accuracy can be generated by carrying out statistic processes and analysis assuming the dithering method used for generating the image to be compressed. Furthermore, not only raising the compression efficiency, but also reducing time required for template decision can be attained by the invention, by using a database that stores relationship between the used dithering method and the template generated.

Additionally, a template that can contribute to higher prediction accuracy can be obtained by applying an artificial intelligence technology such as the genetic algorithm to adaptively adjust the basic template that is obtained by the above-mentioned method, according to the pattern of the image. Speed up of template decision can be also realized at the same time by cutting out a portion of the image without impairing image features in a large view.

Moreover, it is possible to construct a data compression system that becomes wiser as it is used more, by composing the system so that the obtained template is fed back for renewing the database. This means that a template that contributes to higher prediction accuracy can be obtained rapidly, by processing image data having similar features repeatedly, even without using any artificial intelligence technologies.

What is claimed is:

1. A predictive data coding apparatus for still images containing a template generating means comprising:

a database means that stores template information relating with positions of reference pixels together with the attribute parameters of the data;

a looking up means to look up template information in said database means using said attribute parameters as looking up keys;

a deciding means that decides whether optimization should be carried out or not according to a capability of the template that is obtained by said looking up means;

a template optimizing means that generates the optimum template by using an optimization method that uses one or both of the code compression rate and the entropy as an estimation function and a registering means that registers the template information that is outputted from said template optimizing means to said database means wherein;

a prediction of the value of a pixel in said image information is carried out by using the status of pixels that surround said pixel, said template with higher accuracy is generated through statistical processing and through analysis, assuming the dithering type used for generating the image to be compressed and additionally selecting reference pixels out of ideally placed pixels of the dither images by using a database in which relationship between the assumed dithering type and the template, and said image information is coded by using the result of said prediction.

2. A predictive data coding apparatus as claimed in claim 1, wherein the optimization method used for said template optimization is either one of the enumeration method, the genetic algorithm, the evolution strategy, the hill-climbing method, the annealing method, the taboo seeking method and the greedy algorithm.

3. A predictive data coding apparatus as claimed in claim 1, wherein said looking up means contains a temporary template generating means that generates a temporary template by analyzing the inputted data and a re-looking up means that searches said database means based on said template information.

4. A predictive data coding apparatus as claimed in claim 1, wherein said data coding apparatus further contains a dividing means that divides the inputted data into a plural number of blocks according to features of the inputted data;

a compressing means that compresses the inputted data based on the template that is outputted from said template generating means and a composing means that composes the output data of said compressing means, said template information and said block information.

5. A predictive data coding method for still images that codes data by using templates that are generated by a template generating method that contains a looking-up step to look up template information in the database which stores template information relating with positions of reference pixels together with the attribute parameters of the data, by using attribute parameters as looking-up keys;

a deciding step to decide whether template optimization should be carried out or not according to a capability of the template obtained as the result of said looking-up step, a generating step to generate the optimum template by an optimization method using either one of or both of the code compression rate and the entropy when decision is made that optimization should be done, and a registering step to register the template information of the optimized template into said database, wherein;

a prediction of the value of a pixel in said image information is carried out by using the status of pixels that surround said pixel, said template with higher accuracy is generated through statistical processing and through analysis, assuming the dithering type used for generating the image to be compressed and additionally selecting reference pixels out of ideally placed pixels of the dither images by using a database in which relationship between the assumed dithering type and the template, and said image information is coded by using the result of said prediction.

6. A predictive data coding method as claimed in claim 5, wherein said optimization method is either one of the enumeration method, the genetic algorithm, the evolution strategy, the hill-climbing method, the annealing method, the taboo seeking method and the greedy algorithm.

* * * * *